US012743116B2

(12) United States Patent
Potera et al.

(10) Patent No.: US 12,743,116 B2
(45) Date of Patent: Sep. 22, 2026

(54) SEMICONDUCTOR TRANSISTORS HAVING MINIMUM GATE-TO-SOURCE VOLTAGE CLAMP CIRCUITS

(71) Applicant: Wolfspeed, Inc., Durham, NC (US)

(72) Inventors: Rahul R Potera, Apex, NC (US); Andreas Scholze, Cary, NC (US); Jianwen Shao, Cary, NC (US); Edward R. Van Brunt, Cary, NC (US); Philipp Steinmann, Durham, NC (US); James T. Richmond, Hillsborough, NC (US)

(73) Assignee: Wolfspeed, Inc., Durham, NC (US)

( * ) Notice: Subject to any disclaimer, the term of this patent is extended or adjusted under 35 U.S.C. 154(b) by 455 days.

(21) Appl. No.: 18/466,031

(22) Filed: Sep. 13, 2023

(65) Prior Publication Data

US 2023/0418319 A1 Dec. 28, 2023

Related U.S. Application Data

(63) Continuation-in-part of application No. 18/093,838, filed on Jan. 6, 2023, now Pat. No. 12,393,214, which (Continued)

(51) Int. Cl.
*G05F 1/569* (2006.01)
*G01R 31/50* (2020.01)

(Continued)

(52) U.S. Cl.
CPC ............. *G05F 1/569* (2013.01); *G01R 31/50* (2020.01); *G05F 3/20* (2013.01); *H10D 62/8325* (2025.01)

(58) Field of Classification Search
CPC ..... H01L 21/322; H01L 21/336; H01L 21/76; H01L 23/4824; H01L 28/20; H03K 17/0412–13; H01N 19/00; H01K 21/04; H01K 21/311; H01K 21/0255–0288; H01K 29/12; H01K 29/78; H01K 29/0653;

(Continued)

(56) References Cited

U.S. PATENT DOCUMENTS 3,475,653 A 10/1969 Odenberg et al.
4,142,115 A 2/1979 Nakata et al.

(Continued)

FOREIGN PATENT DOCUMENTS

EP 0224274 A2 6/1987
EP 0437939 A1 7/1991

(Continued)

OTHER PUBLICATIONS

"Japanese Office Action in Corresponding Patent Application No. 2021-576295, mailed Apr. 7, 2023, 15 pages".

(Continued)

*Primary Examiner* — Crystal L Hammond
*Assistant Examiner* — Nusrat Quddus
(74) *Attorney, Agent, or Firm* — Myers Bigel, P.A.

(57) ABSTRACT

Transistors are provided that comprise a silicon carbide based semiconductor layer structure, a first current terminal, a second current terminal, a gate terminal, and a minimum gate terminal-to-second current terminal voltage clamp circuit in the semiconductor layer structure that is coupled between the gate terminal and the second current terminal.

31 Claims, 19 Drawing Sheets

Related U.S. Application Data is a continuation of application No. 16/448,538, filed on Jun. 21, 2019, now Pat. No. 11,579,645.

(51) Int. Cl.
*G05F 3/20* (2006.01)
*H10D 62/832* (2025.01)

(58) Field of Classification Search
CPC ............. H01K 29/657; H01K 29/7803; H01K 29/7804; H01K 29/7808; H01K 29/0623
See application file for complete search history.

(56) References Cited

U.S. PATENT DOCUMENTS 4,760,434 A 7/1988 Tsuzuki et al.
4,893,159 A 1/1990 Suzuki et al.
5,119,162 A 6/1992 Todd et al.
5,311,391 A 5/1994 Dungan et al.
5,631,494 A 5/1997 Sakurai et al.
5,691,557 A 11/1997 Watanabe
5,754,074 A 5/1998 Kelly
5,812,006 A 9/1998 Teggatz et al.
5,825,603 A 10/1998 Parat et al.
5,886,543 A 3/1999 Moody
5,894,200 A 4/1999 Goodale et al.
5,978,192 A 11/1999 Young et al.
6,541,826 B2 4/2003 Iwagami et al.
6,906,386 B2 6/2005 Williams et al.
7,511,357 B2 3/2009 Hshieh
8,022,505 B2 9/2011 Renaud et al.
8,437,109 B1 5/2013 Wu
8,743,518 B1 6/2014 Ozard
9,136,381 B1 9/2015 Kocon et al.
9,349,721 B2 5/2016 Saito et al.
9,379,181 B2 6/2016 Sugimoto
9,786,778 B1 10/2017 Morizuka
9,998,109 B1 6/2018 Das et al.
10,026,728 B1 7/2018 Agam et al.
10,529,812 B1 1/2020 Edwards
10,879,692 B2 12/2020 Kubo et al.
10,950,596 B2 3/2021 Zeng et al.
11,322,610 B2 5/2022 Kim et al.
11,810,912 B2* 11/2023 Ji ......................... H10D 84/141
11,923,832 B1* 3/2024 Xu ....................... H03K 17/063
11,955,478 B2* 4/2024 Arnold ................... H10D 84/01
2002/0018330 A1 2/2002 Bremond et al.
2002/0113274 A1* 8/2002 Iwagami .............. H10D 84/811 257/213
2003/0141918 A1 7/2003 Uno
2004/0084753 A1 5/2004 Fruth et al.
2004/0113172 A1 6/2004 Yasuda
2005/0122748 A1 6/2005 Tadokoro et al.
2005/0167742 A1 8/2005 Challa et al.
2006/0113593 A1 6/2006 Sankin et al.
2006/0203400 A1 9/2006 Bodano et al.
2006/0284276 A1 12/2006 Yilmaz
2007/0168638 A1 7/2007 Hepkin et al.
2007/0258176 A1 11/2007 Ball et al.
2007/0290738 A1 12/2007 Wendt et al.
2008/0258224 A1 10/2008 Hshieh
2008/0272828 A1 11/2008 Min
2009/0195947 A1 8/2009 Ootsuka et al.
2010/0001783 A1 1/2010 Ronsisvalle et al.
2011/0049564 A1 3/2011 Guan et al.
2011/0073906 A1 3/2011 Bobde et al.
2011/0127586 A1 6/2011 Bobde et al.
2011/0227095 A1 9/2011 Treu et al.
2012/0007138 A1 1/2012 Nguyen
2012/0037955 A1 2/2012 Hirler et al.
2012/0120531 A1 5/2012 Abou-Khalil et al.
2012/0193676 A1 8/2012 Bobde et al.
2012/0236456 A1 9/2012 Yu
2012/0292636 A1 11/2012 Zhang et al.
2013/0026493 A1 1/2013 Cheng et al.
2013/0063846 A1 3/2013 Pierco et al.
2013/0069064 A1* 3/2013 Yoshihira ............. H10D 84/148 257/E27.016
2013/0140616 A1 6/2013 Schulze et al.
2013/0146971 A1 6/2013 Hirler et al.
2013/0193454 A1 8/2013 Bergenek
2013/0313653 A1* 11/2013 Brech ................. H01L 23/4824 257/E27.081
2013/0314833 A1 11/2013 Smith et al.
2014/0111893 A1 4/2014 Kato et al.
2014/0138737 A1 5/2014 Bobde et al.
2014/0177113 A1 6/2014 Gueorguiev et al.
2014/0268443 A1 9/2014 Nassar et al.
2014/0332877 A1 11/2014 Noebauer et al.
2014/0334522 A1 11/2014 Meiser et al.
2015/0021659 A1 1/2015 Rountree
2015/0028351 A1 1/2015 Van Brunt et al.
2015/0076521 A1 3/2015 Tanaka et al.
2015/0084118 A1 3/2015 Van Brunt et al.
2015/0084125 A1 3/2015 Pala et al.
2015/0138678 A1 5/2015 Parthasarathy et al.
2015/0162321 A1 6/2015 Briere
2015/0364468 A1 12/2015 Kiep et al.
2016/0013639 A1 1/2016 Willkofer et al.
2016/0043169 A1 2/2016 Guan et al.
2016/0148925 A1 5/2016 Tonazzo
2016/0163689 A1 6/2016 Laven et al.
2016/0181391 A1 6/2016 Bobde et al.
2016/0247799 A1 8/2016 Stafanov et al.
2016/0285255 A1 9/2016 O'Donnell et al.
2017/0019096 A1* 1/2017 Vecino Vazquez ..... H02M 1/08
2017/0054360 A1 2/2017 Uemura
2017/0149430 A1 5/2017 Dupuy et al.
2017/0194438 A1 7/2017 Kumagai et al.
2017/0200785 A1 7/2017 Janssens
2017/0229536 A1* 8/2017 Stuber .................. H10D 62/108
2017/0248646 A1 8/2017 Mauder et al.
2017/0256938 A1 9/2017 Fukuhara
2017/0338809 A1 11/2017 Stefanov et al.
2017/0345891 A1 11/2017 Van et al.
2017/0373491 A1 12/2017 Schork et al.
2018/0114788 A1 4/2018 Ahlers et al.
2018/0166994 A1 6/2018 Dorn et al.
2018/0166999 A1 6/2018 Pidutti et al.
2018/0269313 A1 9/2018 Bina et al.
2018/0301553 A1 10/2018 Weyers et al.
2018/0350797 A1 12/2018 Lee et al.
2018/0366569 A1 12/2018 Zeng et al.
2019/0067174 A1 2/2019 Seok
2019/0067493 A1 2/2019 Seok
2019/0131964 A1 5/2019 Bryant
2019/0198666 A1 6/2019 Kim et al.
2019/0287959 A1 9/2019 Hua et al.
2019/0393334 A1 12/2019 Weyers et al.
2020/0035669 A1 1/2020 Tamaru et al.
2020/0169079 A1 5/2020 Smith
2020/0212664 A1 7/2020 Takuma et al.
2020/0295174 A1* 9/2020 Sabri ...................... H10D 30/66
2020/0335493 A1 10/2020 Arnold et al.
2020/0343721 A1 10/2020 Parthasarathy et al.
2020/0403397 A1 12/2020 Nakagawa et al.
2021/0193646 A1 6/2021 Zeng et al.
2022/0044982 A1 2/2022 Mongin et al.
2022/0102487 A1 3/2022 Siemieniec et al.
2022/0271156 A1 8/2022 Peters et al.
2023/0023195 A1* 1/2023 Ugur .................... H10D 84/811
2023/0026868 A1* 1/2023 Ji ......................... H10D 64/519

FOREIGN PATENT DOCUMENTS

EP 0702455 A2 3/1996
EP 1041634 A1 10/2000
EP 1063757 A2 12/2000
EP 3419170 A1 12/2018
JP 62229866 A 10/1987
JP H11251594 A 9/1999
JP 2005175054 A 6/2005
JP 2006041441 A 2/2006
JP 2008172411 A 7/2008

(56) References Cited

FOREIGN PATENT DOCUMENTS

| | | | |
|---|---|---|---|
| JP | 5272183 | B2 | 5/2013 |
| JP | 2014216465 | A | 11/2014 |
| JP | 2015103605 | A | 6/2015 |
| JP | 2015115608 | A | 6/2015 |
| WO | 2013161420 | A1 | 10/2013 |

OTHER PUBLICATIONS

"International Search Report and Written Opinion for International Patent Application No. PCT/US2020/036251, mailed Sep. 1, 2020, 14 pages".

"Translation of Japanese Office Action in Corresponding Patent Application No. 2023-172691, mailed Mar. 11, 2025, 4 pages".

* cited by examiner $I_F$ $V_R$ -15 -10 -5 5 10 $V_F$ $I_R$

SEMICONDUCTOR TRANSISTORS HAVING MINIMUM GATE-TO-SOURCE VOLTAGE CLAMP CIRCUITS

CROSS-REFERENCE TO RELATED APPLICATIONS

The present application claims priority under 35 U.S.C. § 120 as a continuation-in-part of U.S. patent application Ser. No. 18/093,838, filed Jan. 6, 2023, which in turn claims priority under 35 U.S.C. § 120 as a continuation of U.S. patent application Ser. No. 16/448,538, filed Jun. 21, 2019, the entire content of each of which is incorporated herein by reference as if set forth fully herein.

FIELD

The present disclosure is related to transistor semiconductor die, and in particular to transistor semiconductor die with improved protection against short circuit events.

BACKGROUND

Transistor devices such as metal-oxide semiconductor field-effect transistors (MOSFETs), insulated gate bipolar transistors (IGBTs), junction field-effect transistors (JFETs), and bipolar junction transistors (BJTs) are often used in power electronics, in which they may be used to selectively deliver current to and from a load. In certain situations, a load may provide a short circuit across a transistor device. Such a short circuit event may cause the transistor device to fail.

In recent years, there has been a push towards using wide bandgap semiconductor material systems for devices used in power electronics. For example, silicon carbide transistors are now in widespread use in power electronics. Compared to their silicon counterparts, silicon carbide transistors provide better performance, for example, by providing higher blocking voltage, lower on-state resistance, and lower switching loss. Silicon carbide transistors are also much smaller in size, and thus have higher current density. Accordingly, the short circuit withstand time, or the amount of time that a device can survive without failure during a short circuit event, of a silicon carbide transistor is much lower than that of a similar silicon device.

In light of the above, there is a present need for silicon carbide transistor devices with improved short circuit protection.

SUMMARY

In one embodiment, a transistor semiconductor die includes a first current terminal, a second current terminal, and a control terminal. A semiconductor structure is between the first current terminal, the second current terminal, and the control terminal and configured such that a resistance between the first current terminal and the second current terminal is based on a control signal provided at the control terminal. Short circuit protection circuitry is coupled between the control terminal and the second current terminal. In a normal mode of operation, the short circuit protection circuitry is configured to provide a voltage drop between the control terminal and the second current terminal that is greater than a voltage of the control signal. In a short circuit protection mode of operation, the short circuit protection circuitry is configured to provide a voltage drop between the control terminal and the second current terminal that is less than a voltage of the control signal. Accordingly, the short circuit protection circuit is configured to protect the transistor semiconductor die from failure due to a short circuit condition while not interfering with the operation of the transistor semiconductor die in a normal mode of operation.

Pursuant to further embodiments of the present invention, transistors are provided that comprise a silicon carbide based semiconductor layer structure, a first current terminal, a second current terminal, a gate terminal, and a minimum gate terminal-to-second current terminal voltage clamp circuit that is coupled between the gate terminal and the second current terminal.

In some embodiments, the minimum gate terminal-to-second current terminal voltage clamp circuit may comprise at least one diode, and the first current terminal and the second current terminal are on opposed major surfaces of the semiconductor layer structure. In some embodiments, a cathode of the at least one diode is coupled to the gate terminal and an anode of the at least one diode is coupled to the second current terminal. The at least one diode may be a bidirectional diode such as, for example, a Zener diode, in some embodiments.

In some embodiments, the at least one diode comprises a single diode, and a forward voltage drop of the single diode corresponds to a voltage to which the minimum gate terminal-to-second current terminal voltage is clamped. In some embodiments, an absolute value of a reverse voltage drop of the single diode exceeds a maximum on-state gate terminal-to-second current terminal voltage of the transistor. In some embodiments, the at least one diode comprises a plurality of diodes, and an inverse of a combined forward voltage drop of the plurality of diodes corresponds to a voltage to which the minimum gate terminal-to-second current terminal voltage is clamped. In some embodiments, an absolute value of a combined reverse voltage drop of the plurality of diodes exceeds a maximum on-state gate terminal-to-second current terminal voltage of the transistor.

In some embodiments, the semiconductor layer structure may comprise a drift region having a first conductivity type, a first well region having a second conductivity type in an upper portion of the drift region, a first implanted region in the first well region, the first implanted region having the first conductivity type, and a second implanted region that has the second conductivity type, and the at least one diode may comprise a first diode that comprises the first and second implanted regions. In some embodiments, the first implanted region may directly contact a gate structure that is electrically connected to the gate terminal. In some embodiments, the second implanted region may directly contact a metal connector that is between the gate structure (e.g., a gate pad or a gate bus) and a source/drain contact that is electrically connected to the second current terminal.

In some embodiments, the at least one diode may further comprise a second diode that is formed in the semiconductor layer structure and that at least partially vertically overlaps the floating metal connector. In such embodiments, the semiconductor layer structure may further comprise a second well region having a second conductivity type in the upper portion of the drift region, a fifth implanted region in the second well region, the fifth implanted region having the first conductivity type, and a sixth implanted region that is at least partially in the second well region, the sixth implanted region having the second conductivity type, where the second diode comprises the fifth and sixth implanted regions. In some embodiments, the fifth implanted region may directly contact the metal connector and the sixth implanted region directly contacts the source/drain contact. In some embodiments, the second implanted region may have a doping concentration that is at least an order of magnitude greater than a doping concentration of the first well region, and the sixth implanted region has a doping concentration that is at least an order of magnitude greater than a doping concentration of the second well region.

In some embodiments, the semiconductor layer structure further comprises a third implanted region that has the second conductivity type and that has a doping concentration that is less than a doping concentration of the first well region, where the third implanted region comprises part of the first diode and is interposed between the first implanted region and the second implanted region. In some embodiments, the semiconductor layer structure may further comprises a fourth implanted region that has the second conductivity type, where the gate structure, the first implanted region, the first well region and the third implanted region all vertically overlap the fourth implanted region. The fourth implanted region may, for example, be in between the drift region and the first implanted region. In some embodiments, the fourth implanted region may extend laterally beyond the first well region toward the second implanted region by a distance y, where y is large enough to prevent a parasitic bipolar junction transistor that comprises at least the first implanted region, the first well region and the drift region from turning on during normal operation of the transistor. In some embodiments, a lateral width of the fourth implanted region may be selected so that a forward voltage drop of the first diode has a preselected value.

In some embodiments, a portion of the first implanted region that contacts the gate structure may be counter-doped with second conductivity type dopants to reduce an effective first conductivity doping concentration of the first implanted region.

In some embodiments, the fourth implanted region may directly contact the second implanted region.

Pursuant to additional embodiments of the present invention, transistors are provided that comprise a silicon carbide based semiconductor layer structure, a first current terminal, a second current terminal, a gate terminal, and a circuit comprising at least one diode that is coupled anode-to-cathode between the second current terminal and the gate terminal. The at least one diode may be in the semiconductor layer structure.

In some embodiments, a minimum off-state voltage drop between the second current terminal and the gate terminal may be clamped to an inverse of a forward voltage drop of the one or more diodes. In some embodiments, the one or more diodes may be a single diode that is a Zener diode. In some embodiments, a forward voltage drop of the single diode may exceed 4.5 volts. In some embodiments, an absolute value of a reverse voltage drop of the single diode may exceed a maximum on-state gate terminal-to-second current terminal voltage of the transistor.

In some embodiments, the semiconductor layer structure may comprise a drift region having a first conductivity type, a first well region having a second conductivity type in an upper portion of the drift region, a first implanted region in the first well region, the first implanted region having the first conductivity type, a second implanted region that has the second conductivity type, and a third implanted region that has the second conductivity type and that has a doping concentration that is at least an order of magnitude less than a doping concentration of the second implanted region, where the third implanted region is in between the first implanted region and the second implanted region. In some embodiments, the one or more diodes is a single diode that comprises at least portions of the first through third implanted regions. In some embodiments, the single diode may further comprise a portion of the first well region. In some embodiments, the second implanted region may have a doping concentration that is at least an order of magnitude greater than a doping concentration of the first well region.

In some embodiments, the semiconductor layer structure may further comprise a fourth implanted region that has the second conductivity type and a doping concentration that exceeds a doping concentration of the first well region by at least an order of magnitude, where the gate structure, the first implanted region, the first well region and the third implanted region all vertically overlap the fourth implanted region. In some embodiments, the fourth implanted region may be in between the drift region and the first implanted region. In some embodiments, the fourth implanted region may extend laterally beyond the first well region toward the second implanted region by a distance y, where y is large enough to prevent a parasitic bipolar junction transistor that comprises at least the first implanted region, the first well region and the drift region from turning on during normal operation of the transistor. In some embodiments, a lateral width of the third implanted region may be selected so that a forward voltage drop of the single diode has a preselected value.

In some embodiments, the first implanted region may contact a gate structure of the transistor. In some embodiments, a first portion of the first implanted region that contacts the gate structure is counter-doped with second conductivity type dopants to reduce an effective first conductivity doping concentration of the first portion of the first implanted region.

In some embodiments, the fourth implanted region contacts the second implanted region.

In some embodiments, the at least one diode comprises a plurality of bidirectional diodes.

In some embodiments, a minimum gate terminal-to-second current terminal voltage drop of the transistor is clamped to an inverse of a combined forward voltage drop of the plurality of diodes. In some embodiments, an absolute value of a reverse voltage drop of the plurality of diodes exceeds a maximum on-state gate terminal-to-second current terminal voltage of the transistor.

In some embodiments, the semiconductor layer structure comprises a drift region having a first conductivity type, a first well region having a second conductivity type in an upper portion of the drift region, a first implanted region in the first well region, the first implanted region having the first conductivity type, and a second implanted region that has the second conductivity type, where the plurality of diodes comprises a first diode that comprises the first and second implanted regions.

In some embodiments, the first implanted region directly contacts a gate structure, where the gate structure comprises the gate terminal or a structure that is electrically connected to the gate terminal. In some embodiments, the second implanted region directly contacts a metal connector that is between the gate structure and a source/drain contact that is electrically connected to the second current terminal.

In some embodiments, the plurality of diodes further comprises a second diode that is formed in the semiconductor layer structure and that at least partially vertically overlaps the metal connector. In some embodiments, the second diode comprises a second well region having a second conductivity type in the upper portion of the drift region, a fifth implanted region in the second well region, the fifth implanted region having the first conductivity type, and a sixth implanted region that is at least partially in the second well region, the sixth implanted region having the second conductivity type. In some embodiments, the fifth implanted region directly contacts the metal connector and the sixth implanted region directly contacts the source/drain contact. In some embodiments, the second implanted region has a doping concentration that is at least an order of magnitude greater than a doping concentration of the first well region, and the sixth implanted region has a doping concentration that is at least an order of magnitude greater than a doping concentration of the second well region.

Pursuant to still further embodiments of the present invention, transistors are provided that comprise a silicon carbide based semiconductor layer structure, a first current terminal, a second current terminal that is electrically connected to a first source/drain contact, and a gate structure that includes a gate pad, a plurality of gate fingers, and one or more gate buses that electrically connect at least some of the gate fingers to the gate pad. The semiconductor layer structure comprises a drift region having a first conductivity type, a first well region having a second conductivity type in an upper portion of the drift region, a first implanted region in the first well region, the first implanted region having the first conductivity type and directly contacting the gate structure, and a second implanted region that has the second conductivity type. The first and second implanted regions comprise a first diode that is interposed in between the first source/drain contact and the gate structure In some embodiments, first diode is coupled anode-to-cathode between the gate structure and the second current terminal. In some embodiments, the semiconductor layer structure further comprises a third implanted region that has the second conductivity type and that has a doping concentration that is at least an order of magnitude less than a doping concentration of the second implanted region, where the third implanted region is in between the first implanted region and the second implanted region and is part of the first diode.

In some embodiments, the semiconductor layer structure further comprises a fourth implanted region that has the second conductivity type and a doping concentration that exceeds a doping concentration of the first well region by at least an order of magnitude, where the gate structure, the first implanted region, the first well region and the third implanted region all vertically overlap the fourth implanted region. In some embodiments, the fourth implanted region is in between the drift region and the first implanted region. In some embodiments, the fourth implanted region extends laterally beyond the first well region toward the second implanted region by a distance y, where y is large enough to prevent a parasitic bipolar junction transistor that comprises at least the first implanted region, the first well region and the drift region from turning on during normal operation of the transistor die.

In some embodiments, a lateral width of the third implanted region is selected so that a forward voltage drop of the single diode has a preselected value.

In some embodiments, a first portion of the first implanted region that contacts the gate structure is counter-doped with second conductivity type dopants to reduce an effective first conductivity doping concentration of the first portion of the first implanted region.

In some embodiments, the fourth implanted region contacts the second implanted region.

In some embodiments, a minimum off-state voltage drop between the second current terminal and the gate structure is clamped to a forward voltage drop of the one or more diodes.

In some embodiments, the semiconductor layer structure further comprises a second well region having a second conductivity type in the upper portion of the drift region, a fifth implanted region in the second well region, the fifth implanted region having the first conductivity type, and a sixth implanted region that is at least partially in the second well region, the sixth implanted region having the second conductivity type, where the fifth implanted region and the sixth implanted region comprise a second diode that is coupled in series with the first diode between the gate structure and the second current terminal.

In some embodiments, the first diode is coupled to the second diode via a metal connector that is between the gate structure and the first source/drain contact.

In some embodiments, the metal connector vertically overlaps both the first diode and the second diode.

Those skilled in the art will appreciate the scope of the present disclosure and realize additional aspects thereof after reading the following detailed description of the preferred embodiments in association with the accompanying drawing figures

BRIEF DESCRIPTION OF THE DRAWING

The accompanying drawing figures incorporated in and forming a part of this specification illustrate several aspects of the disclosure, and together with the description serve to explain the principles of the disclosure.

Figure 1:
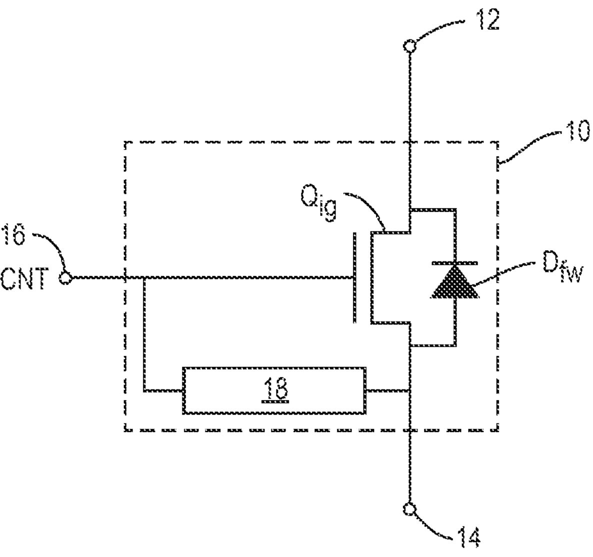
FIG. 1 is a schematic representation of a transistor semiconductor die according to one embodiment of the present disclosure.

Note that herein two part reference numerals that include two numbers separated by a hyphen may be used when multiple instances of a particular element are present. The full reference numeral is used to refer to a specific instance of the element, while the first part of the reference numeral may be used to refer to the elements collectively.

DETAILED DESCRIPTION

FIG. 1 shows a schematic representation of a transistor semiconductor die 10 according to one embodiment of the present disclosure. The transistor semiconductor die 10 includes a first current terminal 12, a second current terminal 14, and a control terminal 16. A semiconductor structure between the first current terminal 12, the second current terminal 14, and the control terminal 16 forms a transistor device $Q_{ig}$ such that a resistance between the first current terminal 12 and the second current terminal 14 is based on a control signal CNT provided at the control terminal 16. As shown in FIG. 1, the transistor device $Q_{ig}$ is a metal-oxide semiconductor field-effect transistor (MOSFET). Accordingly, the first current terminal 12 is a drain terminal, the second current terminal 14 is a source terminal, and the control terminal 16 is a gate terminal. However, the principles of the present disclosure apply equally to any transistor device such as an insulated gate bipolar transistor (IGBT). In the case of an IGBT, the first current terminal 12 is a collector terminal, the second current terminal 14 is an emitter terminal, and the control terminal 16 is a gate terminal. Since the transistor device $Q_{ig}$ may be used for power electronics, a freewheeling anti-parallel diode $D_{fw}$ may be coupled in anti-parallel with the transistor device $Q_{ig}$ so that current can be conducted bidirectionally between the first current terminal 12 and the second current terminal 14. In various embodiments, the freewheeling diode $D_{fw}$ may be external from the transistor device $Q_{ig}$, or may be internal to the transistor device $Q_{ig}$, e.g., a body diode.

While the transistor device $Q_{ig}$ is shown herein as an insulated gate device, the principles of the present disclosure apply equally to any transistor device such as bipolar junction transistors (BJTs), and junction field-effect transistors (JFETs). In the case of a BJT, the first current terminal 12 is a collector terminal, the second current terminal 14 is an emitter terminal, and the control terminal 16 is a base terminal. In the case of a JFET, the first current terminal 12 is a drain terminal, the second current terminal 14 is a source terminal, and the control terminal 16 is a gate terminal. Further, the transistor device $Q_{ig}$ may be a thyristor. In the case of a thyristor, the first current terminal 12 is an anode, the second current terminal 14 is a cathode, and the control terminal 16 is a gate terminal.

The transistor semiconductor die 10 may utilize a wide bandgap material system such as silicon carbide. As discussed above, the silicon carbide transistor semiconductor die 10 may be more sensitive to short circuit events than their silicon counterparts due to the smaller size and higher current density thereof. Accordingly, short circuit protection circuitry 18 is coupled between the control terminal 16 and the second current terminal 14. The short circuit protection circuitry 18 is configured to operate in a normal mode of operation and a short circuit protection mode of operation. In the normal mode of operation, the short circuit protection circuitry 18 is configured to provide a voltage drop between the control terminal 16 and the second current terminal 14 that is greater than a voltage of the control signal CNT. In the short circuit protection mode of operation, the short circuit protection circuitry 18 is configured to provide a voltage drop between the control terminal 16 and the second current terminal 14 that is less than a voltage of the control signal CNT. In the normal mode of operation when a voltage drop across the short circuit protection circuitry 18 is greater than a voltage of the control signal CNT, the operation of the transistor device $Q_{ig}$ is relatively unaffected. In the short circuit protection mode of operation when a voltage drop across the short circuit protection circuitry 18 is less than a voltage of the control signal CNT, a voltage at the control terminal 16 is lowered such that voltage between the control terminal 16 and the second current terminal 14 (i.e., the gate-to-source voltage of the transistor device $Q_{ig}$) is reduced, which in turn partially or completely shuts off the device. Shutting off the transistor device $Q_{ig}$ protects the device during a short circuit event in order to prevent a failure.

One way in which the above-mentioned functionality may be accomplished is by providing the short circuit protection circuitry 18 such that it has a negative temperature coefficient with respect to a voltage drop across the short circuit protection circuitry 18. In other words, the short circuit protection circuitry 18 may be provided such that a voltage drop across the short circuit protection circuitry 18 decreases as temperature increases. Since during a short circuit event a temperature of the transistor semiconductor die 10 will rapidly increase far above normal operating temperatures thereof, the short circuit protection circuitry 18 may significantly reduce a voltage drop between the control terminal 16 and the second current terminal 14 only when a short circuit event occurs. Note that this functionality requires adequate thermal coupling between the short circuit protection circuitry 18 and the current carrying portion of the transistor semiconductor die 10.

Notably, the short circuit protection circuitry 18 is located on the transistor semiconductor die 10. As discussed in detail below, the short circuit protection circuitry 18 takes up minimal area on the transistor semiconductor die 10 and may be capable of extending a short circuit withstand time of the transistor semiconductor die 10 significantly, and in some cases indefinitely.

Figure 2:
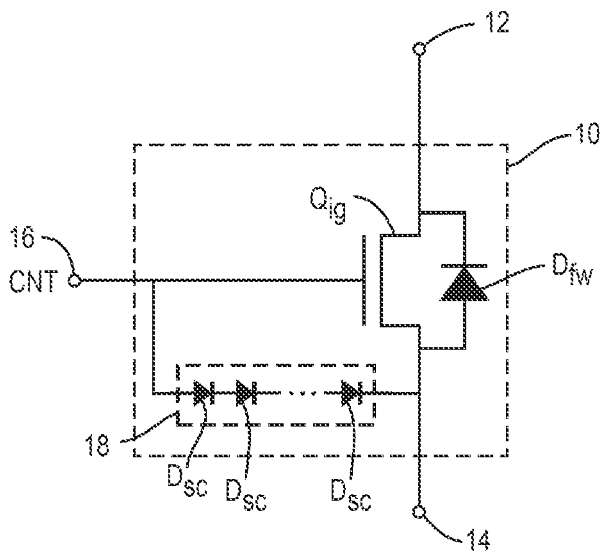
FIG. 2 is a schematic representation of a transistor semiconductor die according to one embodiment of the present disclosure.

FIG. 2 is a schematic representation of the transistor semiconductor die 10 showing details of the short circuit protection circuitry 18 according to one embodiment of the present disclosure. As shown in FIG. 2, the short circuit protection circuitry 18 may include a number of short circuit protection diodes $D_{sc}$ coupled in series between the control terminal 16 and the second current terminal 14. In particular, the short circuit protection diodes $D_{sc}$ are coupled anode-to-cathode between the control terminal 16 and the second current terminal 14 such that an anode of a first one of the short circuit protection diodes $D_{sc}$ is coupled to the control terminal 16 and a cathode of a last one of the short circuit protection diodes $D_{sc}$ is coupled to the second current terminal 14. As discussed above, the short circuit protection diodes $D_{sc}$ may be provided with a negative temperature coefficient (e.g., an exponential negative temperature coefficient) with respect to a forward voltage drop thereof. In other words, the short circuit protection diodes $D_{sc}$ may be provided such that a forward voltage drop across the diodes decreases as temperature increases. Such a negative temperature coefficient is naturally present in silicon carbide diodes. The negative temperature coefficient enables a voltage drop across the short circuit protection diodes $D_{sc}$ to be greater than a voltage of the control signal CNT in the normal mode of operation (and thus not interfere with the operation of the transistor device $Q_{ig}$) and be less than a voltage of the control signal CNT in the short circuit protection mode of operation (thus partially or completely turning off the transistor device $Q_{ig}$). Note that this functionality requires adequate thermal coupling between the short circuit protection circuitry 18 and the current carrying portion of the transistor semiconductor die 10. The number of short circuit protection diodes $D_{sc}$ may be chosen such that when a temperature of the transistor semiconductor die 10 is below a short circuit threshold temperature a voltage drop across the short circuit protection diodes $D_{sc}$ is greater than or equal to a voltage of the control signal CNT and when a temperature of the transistor semiconductor die 10 is above the short circuit threshold temperature a voltage drop across the short circuit protection diodes $D_{sc}$ is significantly less than the voltage of the control signal CNT such that a voltage at the control terminal 16 is lowered enough to partially or completely turn off the transistor device $Q_{ig}$.

In addition to protecting the transistor device $Q_{ig}$ against short circuit events, the short circuit protection circuitry 18 also clamps the maximum voltage of the gate to the combined forward voltage drop of the short circuit protection diodes $D_{sc}$. This has the additional benefits of protecting the transistor device $Q_{ig}$ against electrostatic discharge (ESD) and provides voltage overshoot protection for the gate of the transistor device $Q_{ig}$.

The short circuit protection circuitry 18 may enable significant improvements in the short circuit withstand time of the transistor semiconductor die 10. As discussed herein, the short circuit protection circuitry 18 may require minimal active area on the transistor semiconductor die 10. In various embodiments, an on-state resistance of the transistor semiconductor die 10 may be between 0.1 mΩ/cm$^2$ and 3.0 mΩ/cm$^2$, a blocking voltage of the transistor semiconductor die 10 may be between 600V and 10 kV, and a short circuit withstand time of the transistor semiconductor die 10 may be greater than 3p. Notably, the on-state resistance of the transistor semiconductor die 10 may fall anywhere in the above range, such as between 0.5 mΩ/cm$^2$ and 3.0 mΩ/cm$^2$, between 1.0 mΩ/cm$^2$ and 3.0 mΩ/cm$^2$, between 1.5 mΩ/cm$^2$ and 3.0 mΩ/cm$^2$, between 2.0 mΩ/cm$^2$ and 3.0 mΩ/cm$^2$, between 2.5 mΩ/cm$^2$ and 3.0 mΩ/cm$^2$, and the like. The blocking voltage of the transistor semiconductor die 10 may similarly fall anywhere inside the above range, such as between 600V and 1 kV, between 600V and 2 kV, between 600V and 5 kV, between 1 kV and 5 kV, between 5 kV and 10 kV, and the like. A relationship between the on-state resistance and the blocking voltage of the transistor semiconductor die 10 may be expressed according to Equation (1):

$$R_{on} = 0.8 \times (3 \times 10^{-8}) \times V_{block}^{2.4} \tag{1}$$

where $R_{on}$ is the on-state resistance of the transistor semiconductor die and $V_{block}$ is the blocking voltage of the transistor semiconductor die 10.

The short circuit withstand time of the transistor semiconductor die 10 may be less than 10 s in some embodiments, but the principles of the present disclosure may also enable the transistor semiconductor die 10 to indefinitely withstand a short circuit event in some circumstances. The short circuit withstand time of the transistor semiconductor die 10 may fall anywhere in the above ranges such that the short circuit withstand time is between 4 μs and 10 s, between 5 μs and 10 s, between 10 μs and 10 s, between 50 μs and 10 s, between 5 ms and 10 s, between 10 ms and 10 s, between 50 ms and 10 s, between is and 10 s, and the like.

Figure 3:
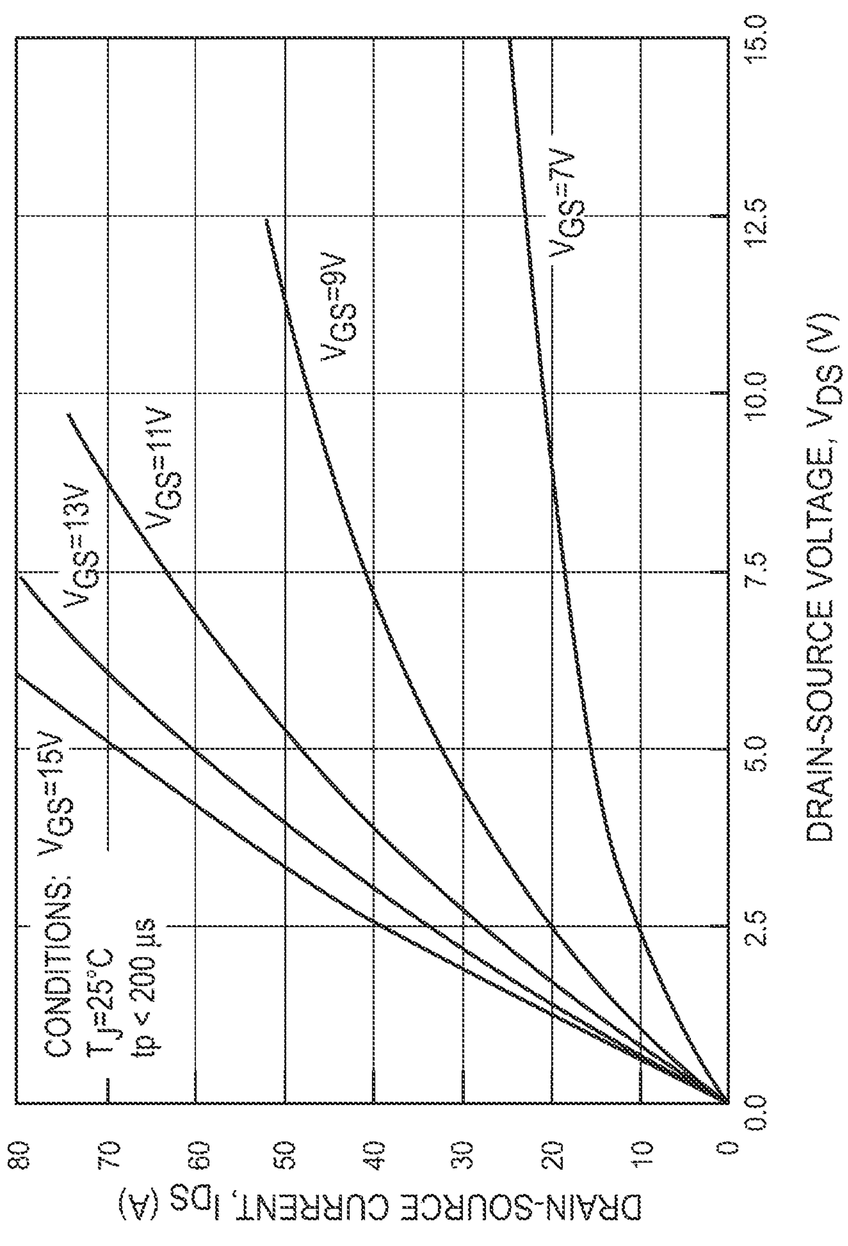
FIG. 3 is a graph illustrating a relationship between drain-source voltage, drain-source current, and gate-source voltage for a metal-oxide semiconductor field-effect transistor (MOSFET) according to one embodiment of the present disclosure.

FIG. 3 is a graph illustrating a relationship between drain-source voltage, drain-source current, and gate-source voltage in a MOSFET. As shown, a relationship between drain-source voltage and drain-source current is dependent on gate-source voltage such that as the gate-source voltage increases, a steepness of the curve between drain-source voltage and drain-source current increases. Accordingly, higher gate-source voltages will lead to higher drain-source currents during a short circuit event. When a drain-source current becomes high enough, the device will fail. By reducing the gate-source voltage during a short circuit event, the drain-source current is significantly reduced such that a failure of the device can be prevented.

Figure 4:
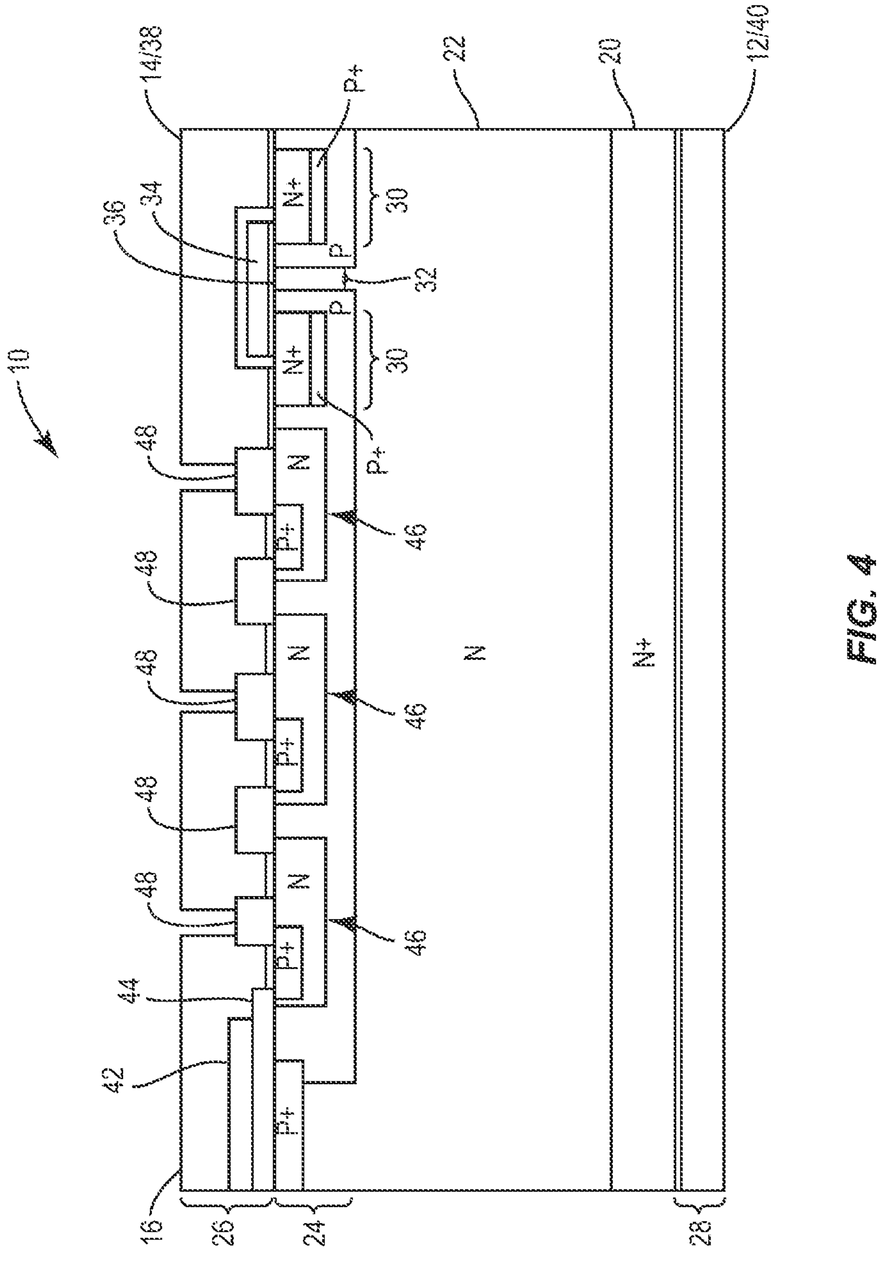
FIG. 4 is a cross-sectional view of a portion of a transistor semiconductor die according to one embodiment of the present disclosure.

FIG. 4 is a cross-sectional view of a portion of the transistor semiconductor die 10 according to one embodiment of the present disclosure. The transistor semiconductor die 10 includes a substrate 20, a drift layer 22 on the substrate 20, a number of implants 24 in the drift layer 22, a top metallization layer 26, and a bottom metallization layer 28. In particular, on the right side of the transistor semiconductor die 10 the transistor device $Q_{ig}$ is provided as a vertical MOSFET including a pair of junction implants 30 in the drift layer 22 such that the junction implants 30 are separated by a JFET gap 32. A gate contact 34 on top of a gate oxide layer 36 runs between the junction implants 30 on a surface of the drift layer 22 opposite the substrate 20. A source contact 38 (which may also be the second current terminal 14) also contacts each one of the junction implants 30 on the surface of the drift layer 22 opposite the substrate. A drain contact 40 (which may also be the first current terminal 12) is on the substrate 20 opposite the drift layer 22. The source contact 38 is provided by a portion of the top metallization layer 26. The drain contact 40 is provided by the bottom metallization layer 28.

On the left side of the transistor semiconductor die 10, the control terminal 16 is provided by a portion of the top metallization layer 26. While not shown, the control terminal 16 is coupled to the gate contact 34 of the transistor device $Q_{ig}$ on a plane not shown in the cross-section (e.g., via a gate runner 42 provided on a field oxide layer 44 below the top metallization layer 26). The control terminal 16 is also coupled to the source contact 38 of the transistor device $Q_{ig}$ through a number of P-N junctions 46 formed in the drift layer 22. Each one of these P-N junctions 46 forms one of the short circuit protection diodes $D_{sc}$ discussed above with respect to FIG. 2. The top metallization layer 26 is appropriately patterned to form connections between the control terminal 16 and the source contact 38 through the P-N junctions 46 as shown. An intermetal dielectric layer 48 may insulate different portions of the top metallization layer 26 to form the desired connection pattern.

While only one unit cell of the transistor device $Q_{ig}$ is shown in FIG. 4, the transistor device $Q_{ig}$ may comprise any number of cells coupled together to provide a desired forward current rating of the transistor semiconductor die 10. Further, while the short circuit protection diodes $D_{sc}$ are shown one next to another in the drift layer 22 in FIG. 4, the short circuit protection diodes $D_{sc}$ may be distributed in any suitable manner in the transistor semiconductor die 10. For example, the short circuit protection diodes $D_{sc}$ may be distributed between different cells of the transistor device $Q_{ig}$ in a pattern in order to reduce the total active area devoted to the short circuit protection diodes $D_{sc}$. In general, the short circuit protection diodes $D_{sc}$ will consume very little area when compared to the transistor device $Q_{ig}$ and thus will have a minimal impact on the total active area of the transistor semiconductor die 10.

Figure 5:
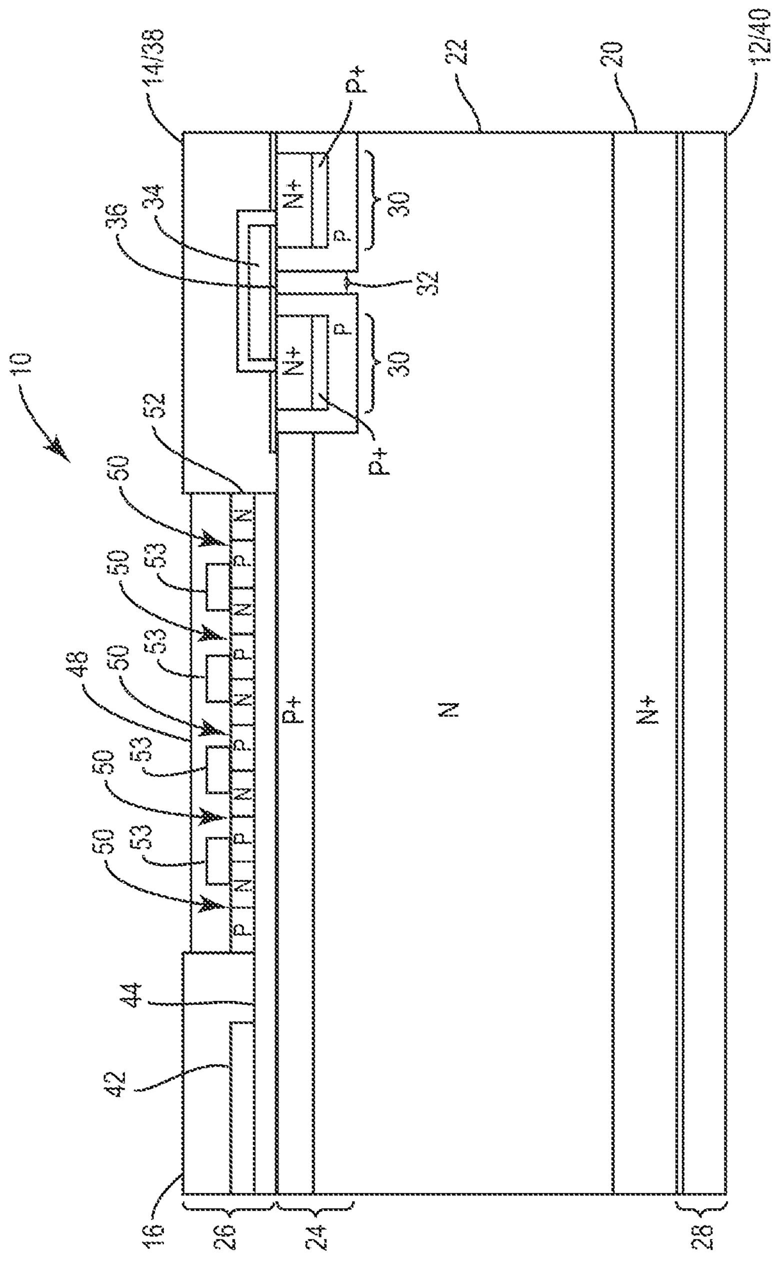
FIG. 5 is a cross-sectional view of a portion of a transistor semiconductor die according to one embodiment of the present disclosure.

FIG. 5 shows the transistor semiconductor die 10 according to an additional embodiment of the present disclosure. The transistor semiconductor die 10 shown in FIG. 5 is substantially similar to that shown in FIG. 4, except that the short circuit protection diodes $D_{sc}$ are provided as a number of P-N junctions 50 formed in an additional semiconductor layer 52 (e.g., a polysilicon layer) that is provided on the drift layer 22 (with the field oxide layer 44 between the additional semiconductor layer 52 and the drift layer 22 to avoid interaction between the layers). A number of metal jumpers 53 may be provided between each adjacent P-N junction 50. In the embodiment shown in FIG. 4 the short circuit protection diodes $D_{sc}$ may be Zener diodes. In such an embodiment, the short circuit protection diodes $D_{sc}$ are coupled in series cathode-to-anode between the insulted gate terminal 16 and the second current terminal 14 such that a cathode of a first one of the short circuit protection diodes $D_{sc}$ is coupled to the control terminal 16 and an anode of a last one of the short circuit protection diodes $D_{sc}$ is coupled to the second current terminal 14. However, the P-N junctions 50 in FIG. 5 may be reversed such that they are coupled anode-to-cathode between the insulated gate terminal 16 and the second current terminal 14 as shown. Providing the short circuit protection diodes $D_{sc}$ in the additional semiconductor layer 52 that is provided on the drift layer 22 may allow a reduction or elimination of the active area devoted to the short circuit protection circuitry 18, since the short circuit protection diodes $D_{sc}$ can be moved over the transistor device $Q_{ig}$ in some embodiments.

Figure 6:
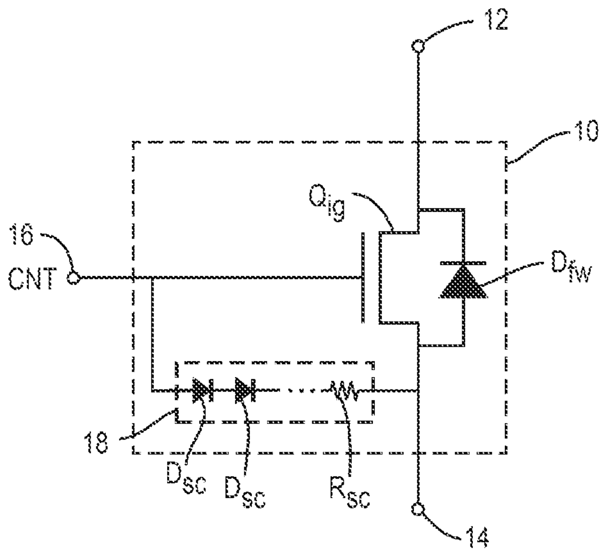
FIG. 6 is a schematic representation of a transistor semiconductor die according to one embodiment of the present disclosure.

FIG. 6 is a schematic representation of the transistor semiconductor die 10 according to an additional embodiment of the present disclosure. The transistor semiconductor die 10 shown in FIG. 6 is substantially similar to that shown in FIG. 2, except that the short circuit protection circuitry 18 further includes a short circuit protection resistive element $R_{sc}$ coupled in series with the short circuit protection diodes $D_{sc}$. The short circuit protection resistive element $R_{sc}$ may be used to achieve a precise voltage drop across the short circuit protection circuitry 18 that may be difficult to achieve using diodes alone. Since using only diodes in the short circuit protection circuitry 18 effectively limits the total voltage drop across the short circuit protection circuitry 18 to integer multiples of the forward voltage drop of the diodes, providing the short circuit protection resistive element $R_{sc}$ allows for more precise tuning of the voltage drop across the short circuit protection circuitry 18. The short circuit protection circuitry 18 may be provided with a negative temperature coefficient with respect to the resistance thereof, such that as the temperature of the transistor semiconductor die 10 increases, the resistance of the short circuit protection resistive element $R_{sc}$ decreases.

Figure 7:
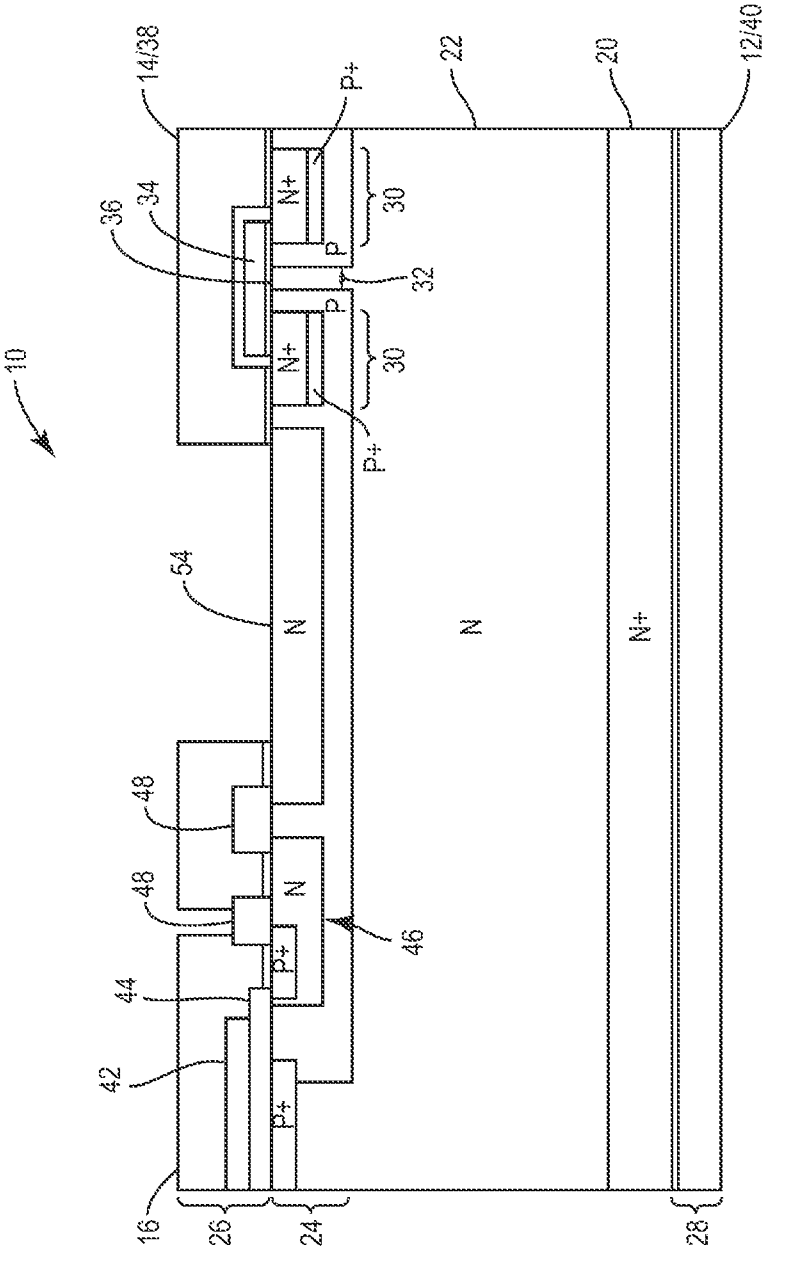
FIG. 7 is a cross-sectional view of a transistor semiconductor die according to one embodiment of the present disclosure.

FIG. 7 is a cross-sectional view of a portion of the transistor semiconductor die 10 according to an additional embodiment of the present disclosure. The transistor semiconductor die 10 shown in FIG. 7 is substantially similar to that shown in FIG. 4, except that the transistor semiconductor die 10 further includes the short circuit protection resistive element $R_{sc}$ coupled between the control terminal 16 and the second current terminal 14. The short circuit protection resistive element $R_{sc}$ may be implemented using a deep N-doped well 54. Providing the short circuit protection resistive element $R_{sc}$ in this manner may ensure a negative temperature coefficient with respect to resistance. While not shown, in other embodiments, the short circuit protection resistive element $R_{sc}$ may be implemented using a highly doped polysilicon resistor, a metal resistor with sufficiently high positive temperature coefficient with respect to resistance, or any other suitable type of resistive element.

Figure 8:
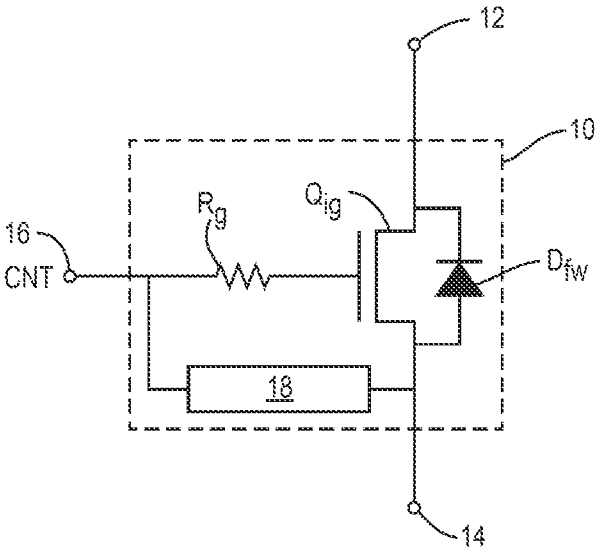
FIG. 8 is a schematic representation of a transistor semiconductor die according to one embodiment of the present disclosure.

FIG. 8 is a schematic representation of the transistor semiconductor die 10 according to an additional embodiment of the present disclosure. The transistor semiconductor die 10 shown in FIG. 8 is substantially similar to that shown in FIG. 1, except that the transistor semiconductor die 10 further includes a gate resistive element $R_g$ coupled between the control terminal 16 and a gate of the transistor device $Q_{ig}$. The gate resistive element $R_g$ is provided with a positive temperature coefficient with respect to a resistance thereof. In other words, a resistance of the gate resistive element $R_g$ increases as a temperature of the transistor semiconductor die 10 increases. Note that this functionality requires adequate thermal coupling between the short circuit protection circuitry 18 and the current carrying portion of the transistor semiconductor die 10. This may reduce a gate drive current in the event of a short circuit event, thereby enhancing the action of the short circuit protection circuitry 18.

Figure 9:
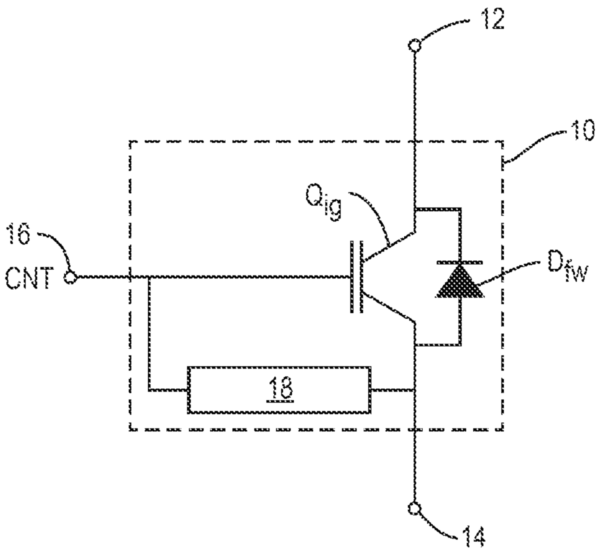
FIG. 9 is a schematic representation of a transistor semiconductor die according to one embodiment of the present disclosure.
Figure 10:
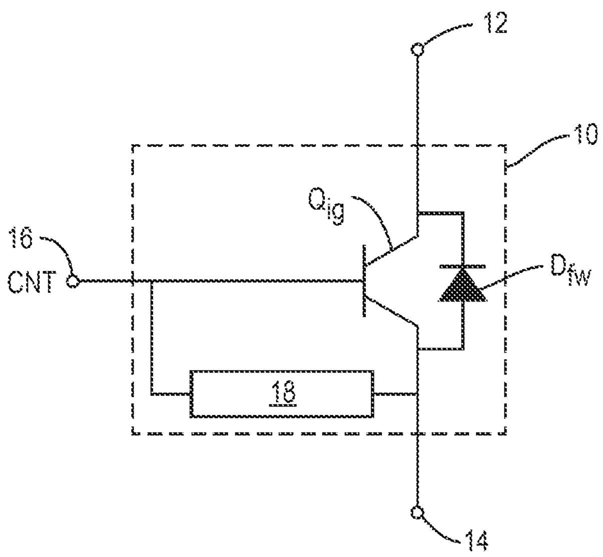
FIG. 10 is a schematic representation of a transistor semiconductor die according to one embodiment of the present disclosure.
Figure 11:
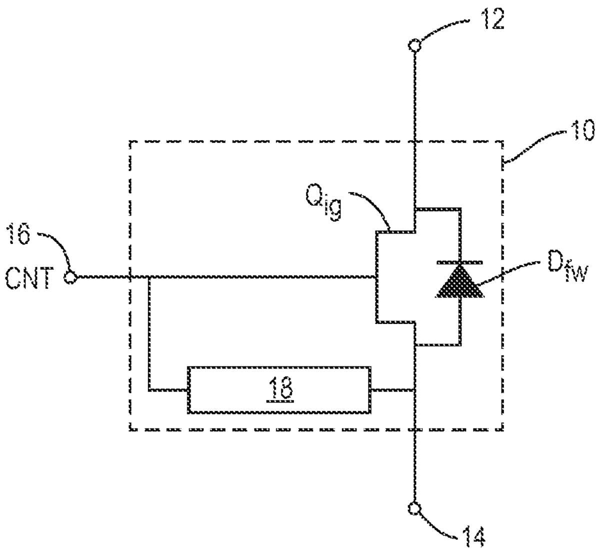
FIG. 11 is a schematic representation of a transistor semiconductor die according to one embodiment of the present disclosure.

As discussed above, while the foregoing examples of transistor semiconductor die 10 are primarily shown depicting the transistor device $Q_{ig}$ as a MOSFET, the principles of the present disclosure apply equally to any type of transistor devices including IGBTs, BJTs, JFETs, and the like. Accordingly, for the sake of completeness FIG. 9 shows a schematic view of the transistor semiconductor die 10 wherein the transistor device $Q_{ig}$ is an IGBT instead of a MOSFET. In this case, the first current terminal 12 is a collector terminal and the second current terminal 14 is an emitter terminal. Those skilled in the art will readily appreciate that the MOSFET depicted in the cross-sectional views of the transistor semiconductor die 10 shown above can be readily replaced with an IGBT, for example, by adding an injector layer between the substrate 20 and the drift layer 22. FIG. 10 shows a schematic view of the transistor semiconductor die 10 wherein the transistor device $Q_{ig}$ is a BJT instead of a MOSFET. In this case, the first current terminal 12 is a collector terminal, the second current terminal 14 is an emitter terminal, and the control terminal 14 is a base terminal. Those skilled in the art will readily appreciate that the MOSFET depicted in the cross-sectional views of the transistor semiconductor die 10 shown above can be readily replaced with a BJT. FIG. 11 shows a schematic view the transistor semiconductor die 10 wherein the transistor device $Q_{ig}$ is a JFET instead of a MOSFET. In this case, the first current terminal 12 is a drain terminal, the second current terminal 14 is a source terminal, and the control terminal 16 is a gate terminal. Those skilled in the art will readily appreciate that the MOSFET depicted in the cross-sectional views of the transistor semiconductor die 10 shown above can be readily replaced with a JFET.

Pursuant to further embodiments of the present invention, transistors such as MOSFETs are provided that include on-die minimum gate-to-source voltage clamp circuits. These circuits can prevent the gate-to-source voltage from falling below a predetermined level, thereby protecting the gate oxide layers of the MOSFET from enhanced electric field values that can shorten the expected lifetime of the transistors. Note that while the discussion below will focus on n-type devices, it will be appreciated that similar on-die voltage clamp circuits may be provided in p-type devices according to further embodiments of the present invention. In p-type devices, the n-type and p-type regions will be reversed from that shown herein.

Transistors such as MOSFETs or semiconductor devices that include MOSFETs (such as IGBTs) may have recommended ranges for the gate-to-source voltages that are applied when the MOSFET is in its off (blocking) state in order to avoid situations where the MOSFET unintentionally turns on because of parasitic effects. One such parasitic effect is a displacement current that can be generated in the MOSFET (or other switching device) as it switches between its on and off states. Since power MOSFETs may conduct large currents and are designed to cycle between their on and off states at high speeds, a power MOSFET may experience large changes in source-to-drain current (I) flow over a very short period of time (t). This change in current is often referred to as dI/dt. The abrupt change in current coupled with the inductance (L) of the current path generates a transient voltage drop that can be expressed as:

$$V_{dI/dt}=(dI/dt)*L$$

This transient voltage $V_{dI/dt}$ drop acts to reduce the instantaneous voltage at the source terminal of the power MOSFET. Thus, the abrupt change in current can cause transient increases in the gate-to-source voltage, which has the potential to cause the MOSFET to turn on when it should be off. To avoid such occurrences, the gate-to-source voltage for off-state operation may be set to be significantly lower than the gate-to-source voltage level at which the MOSFET actually starts to turn-on. Since the source terminal is usually coupled to ground, the gate-to-source voltage typically corresponds to the bias voltage applied to the gate terminal. Thus, a maximum level for this gate bias voltage during off-state operation may be set to a value that is sufficiently below the gate bias voltage that turns on the MOSFET so that transient changes in the source voltage due to dI/dt effects do not cause the MOSFET to turn on when it should be in an off-state.

In addition, a minimum limit on the gate-to-source voltage (and hence the gate bias voltage) during off-state operation may be specified in order to improve the reliability of the power MOSFET. Setting a minimum limit may be beneficial because the gate bias voltage generates an electric field in the gate oxide layer of the MOSFET. As electric fields are applied to the gate oxide layer of the MOSFET, the gate oxide layer is stressed and defects are generated in the oxide material that build up over time. When the concentration of defects reaches a critical value, a "percolation path" may be created through the gate oxide layer that electrically connects the gate electrode to the semiconductor layer structure (e.g., to a source region in the semiconductor layer structure), thereby creating a short-circuit that can destroy the MOSFET. The rate at which the defects build up in the gate oxide layer material is a function of the magnitude of the electric field and the length of time for which the electric field is applied. The "lifetime" of a gate oxide layer (i.e., how long a gate oxide layer will last before gate oxide "breakdown" occurs and one or more percolation paths are formed) is a function of, among other things, the magnitude of the electric field that the gate oxide layer is subjected to and the length of time for which the electric field is applied. The "lifetime" of the gate oxide layer decreases exponentially with increasing electric field levels. Thus, if the magnitude of the minimum gate bias voltage during off-state operation (which is typically a negative voltage) is too large, the electric fields generated by application of the minimum off-state gate bias voltage can, over time, stress the gate oxide layer, leading to premature breakdown.

Thus, for example, if a MOSFET is designed to start turning on when a gate bias voltage of 1-3 volts is applied, the end user may be advised to maintain the gate-to-source bias voltage during off-state operation ("$V_{GS-off}$") below −3.5 volts, in order to ensure that the MOSFET is not inadvertently turned on due to, for example, a dI/dt induced change in the gate-to-source voltage. Such changes can occur when the MOSFET is switched at high speeds, as the cumulative effects of dI/dt induced changes to the source voltage can build up if the MOSFET switches faster than the induced voltage drop dissipates. Moreover, to avoid unduly stressing the gate oxide layer, the minimum off-state gate bias voltage might be specified as, for example, −8 volts. Additionally, setting a minimum value on the gate-to-source voltage may also ease some constraints in the design of the power MOSFET, and hence may make the MOSFET easier to fabricate and/or allow the MOSFET to exhibit improved performance. Thus, the range for the gate bias voltage of a power MOSFET during off-state operation might be specified as, for example being −8 volts<$V_{GS-off}$<−3.5 volts.

Unfortunately, in certain applications, it may be difficult to maintain the gate-to-source voltage within this range. As one example, in certain half bridge rectifier applications MOSFETs will be provided on both the high side and the low side of the circuit. When the MOSFET on the high side of the circuit is turning off, the MOSFET on the low side of the circuit is simultaneously turning on, which acts to reduce or "pull-down" the voltage at the source of the MOSFET on the high side. If the dI/dt value is high (due to fast switching operations), parasitic inductances in the gate-to-source loop of the high side MOSFET can induce ringing in the high side MOSFET that can generate negative voltage spikes that go below a desired minimum limit on the gate-to-source voltage (which in this example, is −8 volts). To prevent this from happening, it may be necessary to limit the switching frequency of the MOSFET or, alternatively, the reliability of the MOSFET may be reduced due to the increased stress on the gate oxide layers that occurs when the gate bias voltage is below −8 volts.

Pursuant to further embodiments of the present invention, transistors are provided that include an on-die minimum gate-to-source voltage clamp circuit that is configured to clamp the minimum gate-to-source voltage to a minimum level. When the minimum gate-to-source voltage is clamped, it is not necessary to limit the switching speed of the MOSFET (or other power semiconductor device) since the gate-to-source voltage cannot go below a desired minimum value. The transistors according to embodiments of the present invention can be fabricated using conventional power MOSFET fabrication equipment and the minimum gate-to-source voltage clamp circuit may only occupy a small area on the semiconductor die. In addition, the minimum gate-to-source voltage clamp circuit may not add significant parasitic capacitances (particularly gate-to-source capacitance, which can negatively impact performance) to the MOSFET, nor does the minimum gate-to-source voltage clamp circuit meaningfully increase the off-state gate-to-source leakage current of the MOSFET.

While end users may add "off-chip" voltage clamp circuits that can maintain the gate-to-source bias voltage of a power MOSFET within a desired range, such off-chip solutions increase the cost of the MOSFET and require that the end users be involved in the overall circuit design. In addition, such off-chip solutions tend to add parasitic inductances (e.g., from transmission lines) in the gate-to-source loop that can reduce the performance of the MOSFET. In contrast, the transistors according to embodiments of the present invention may include monolithically-integrated minimum gate-to-source voltage clamp circuits that do not meaningfully degrade any of the performance characteristics of the MOSFET.

In some embodiments, the minimum gate-to-source voltage clamp circuit may be implemented as one or more diodes that are coupled cathode-to-anode between the gate terminal and the source terminal (i.e., the cathode of each diode is closer to the gate terminal along the electrical path than the anode of the respective diode). The diode(s) of the minimum gate-to-source voltage clamp circuit may be implemented in the semiconductor layer structure of the MOSFET. For example, if the MOSFET is a silicon carbide based power MOSFET, the diode(s) of the minimum gate-to-source voltage clamp circuit may be implemented in the silicon carbide semiconductor layer structure of the MOSFET. In embodiments that include multiple diodes, the electrical connections between the diodes may be made through one or more metal jumpers that may be part of the same metallization layer that is used to form the source and/or gate metallization.

The minimum gate-to-source voltage clamp circuit may be implemented in a very small area, and hence may only take up a small amount of the active area of the die. In some embodiments, an area of the negative voltage clamp circuit (when the semiconductor die is viewed from above in plan view) may be less than 10%, less than 5%, less than 3%, less than 2% or even less than 1% the corresponding area of the active region of the device.

In some embodiments, the diodes included in the minimum gate-to-source voltage clamp circuits may be unidirectional diodes. In other embodiments, the diodes may be bidirectional diodes, such as Zener diodes. When Zener (or other bidirectional) diodes are used, the combined reverse forward drop may be designed to be greater than the maximum on-state gate voltage. The forward voltage drop across the Zener diodes may be set to clamp the minimum value of the gate-to-source voltage at a desired level. For example, if a minimum gate-to-source voltage of −6 volts is desired, then two Zener diodes with forward voltage drops of 3 volts each may be interposed in series between the gate and source terminals. Alternatively, a single Zener diode that is designed to have a forward voltage drop of 6 volts may be used. In some embodiments, a deep shielding region may be formed underneath the gate pad to prevent a parasitic bipolar junction transistor that may be formed in the semiconductor layer structure from turning on at high drain bias voltages (i.e., during reverse blocking operation).

Pursuant to some embodiments of the present invention, transistors are provided that comprise a silicon carbide based semiconductor layer structure, a first current terminal (e.g., a drain terminal), a second current terminal (e.g., a source terminal), and a gate terminal. The first and second current terminals are on opposed major surfaces of the semiconductor layer structure. These transistors further include a minimum gate terminal-to-second current terminal voltage clamp circuit in the semiconductor layer structure that is coupled between the gate terminal and the second current terminal.

The minimum gate terminal-to-second current terminal voltage clamp circuit may comprise at least one diode, and a cathode of the at least one diode may be coupled to the gate terminal and an anode of the at least one diode may be coupled to the second current terminal. The at least one diode may be a bidirectional diode such as a Zener diode. In cases where the minimum gate terminal-to-second current terminal voltage clamp circuit includes a single diode, an inverse of the forward voltage drop of the single diode may correspond to a voltage to which the minimum gate terminal-to-second current terminal voltage is clamped. An absolute value of the reverse voltage drop of the single diode may exceed a maximum on-state gate terminal-to-second current terminal voltage of the transistor.

In other embodiments, the minimum gate terminal-to-second current terminal voltage clamp circuit may include a plurality of diodes (e.g., at least a first diode and a second diode). In such embodiments, an inverse of the a combined forward voltage drop of the plurality of diodes may correspond to a voltage to which the minimum gate terminal-to-second current terminal voltage is clamped.

In some embodiments, the semiconductor layer structure may comprise a drift region having a first conductivity type, a first well region having a second conductivity type in an upper portion of the drift region, a first implanted region in the first well region, the first implanted region having the first conductivity type, and a second implanted region that has the second conductivity type. The first and second implanted regions may comprise at least part of a first diode. The first implanted region may directly contact a gate structure (e.g., a gate pad, a gate bus) that is electrically connected to the gate terminal and/or the second implanted region may directly contact a metal connector that is between the gate structure and a source/drain contact that is electrically connected to the second current terminal. The semiconductor layer structure may further comprise a third implanted region that has the second conductivity type with a doping concentration that is less than a doping concentration of the first well region. The third implanted region may comprise part of the first diode and may be interposed between the first implanted region and the second implanted region. The semiconductor layer structure may also comprise a fourth implanted region that has the second conductivity type, where the gate structure, the first implanted region, the first well region and the third implanted region all vertically overlap the fourth implanted region. The fourth implanted region may be in between the drift region and the first implanted region, and may act as a deep shielding region.

The at least one diode may further comprise a second diode that is formed in the semiconductor layer structure and that at least partially vertically overlaps the metal connector. The second diode may comprise a second well region having a second conductivity type in the upper portion of the drift region, a fifth implanted region in the second well region, the fifth implanted region having the first conductivity type, and a sixth implanted region that is at least partially in the second well region, the sixth implanted region having the second conductivity type. The fifth implanted region may directly contact the metal connector and the sixth implanted region may directly contact the source/drain contact. The second implanted region may have a doping concentration that is at least an order of magnitude greater than a doping concentration of the first well region, and the sixth implanted region may have a doping concentration that is at least an order of magnitude greater than a doping concentration of the second well region.

Pursuant to further embodiments of the present invention, transistors are provided that include a silicon carbide based semiconductor layer structure, a first current terminal (e.g., a drain terminal), a second current terminal (e.g., a source terminal), a gate terminal, and a circuit comprising one or more diodes that are coupled anode-to-cathode between the second current terminal and the gate terminal. These transistors may have the regions and properties described above with reference to the proceeding embodiments.

Figure 12:
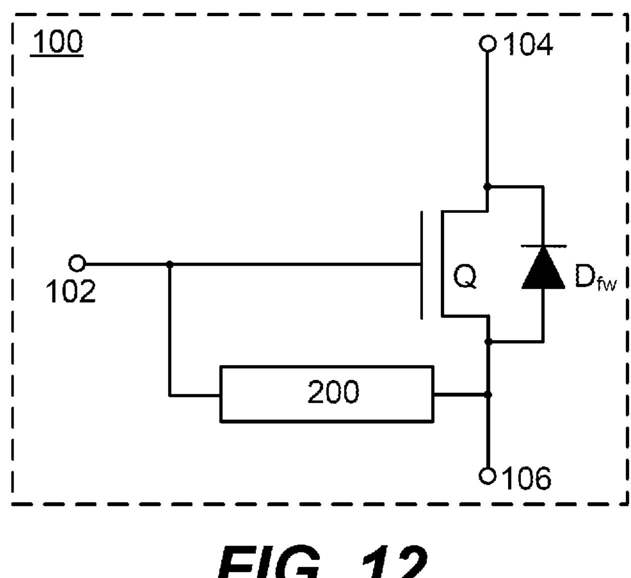
FIG. 12 is a schematic representation of a semiconductor transistor according to further embodiments of the present disclosure that includes a minimum gate-to-source voltage clamp circuit.

FIG. 12 is a schematic representation of a transistor 100 according to embodiments of the present disclosure that includes a minimum gate-to-source voltage clamp circuit. The transistor 100 includes a control (gate) terminal 102, a first current terminal 104, and a second current terminal 106. The discussion below will assume that the transistor 100 is an n-type power MOSFET and hence will refer to the first current terminal 104 as a drain terminal and to the second current terminal 106 as a source terminal. However, it will be appreciated that the power MOSFET 100 may alternatively be a p-type MOSFET or another type of power semiconductor die (e.g., an IGBT) in other embodiments, and that the first current terminal 104, the second current terminal 106, and/or the control terminal 102 may vary based on the type of device implemented. For example, in the case of an n-type IGBT, the first current terminal 104 would be a collector terminal, the second current terminal 106 would be an emitter terminal, and the control terminal 102 would be a gate terminal.

The power MOSFET 100 further includes a semiconductor layer structure that is electrically connected to the drain terminal 104, the source terminal 106, and the gate terminal 102 to form a MOSFET Q. A resistance between the drain terminal 104 and the source terminal 106 is based on a control signal provided at the gate terminal 102. Since the MOSFET Q may be used for power electronics, a freewheeling anti-parallel diode $D_{fw}$ may be coupled in anti-parallel with the MOSFET Q so that current can be conducted bidirectionally between the drain terminal 104 and the source terminal 106. The freewheeling diode $D_{fw}$ may be external to the MOSFET Q, or may be internal to the MOSFET Q.

The power MOSFET 100 may be formed in a wide bandgap material system such as silicon carbide. In such embodiments, the power MOSFET 100 may include a silicon carbide based semiconductor layer structure. This semiconductor layer structure may include at least one semiconductor layer, and will typically include a semiconductor substrate and one or more semiconductor layers that are formed on the semiconductor substrate, typically by epitaxial growth. Various regions having different conductivity types are formed within the one or more semiconductor layers. A minimum gate-to-source voltage clamp circuit 200 is formed in the semiconductor layer structure and coupled between the gate terminal 102 and the source terminal 106. The minimum gate-to-source voltage clamp circuit 200 is configured to prevent the minimum gate-to-source bias voltage from dropping below a predetermined value.

Figure 13:
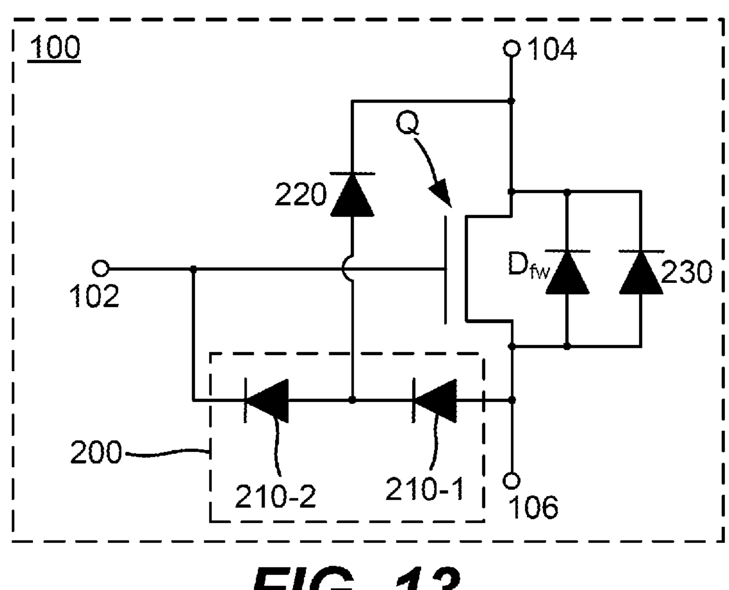
FIG. 13 is a schematic circuit representation of the semiconductor transistor of FIG. 12 that illustrates one possible implementation of the minimum gate-to-source voltage clamp circuit.

FIG. 13 is a schematic circuit representation of the power MOSFET 100 showing one possible implementation of the minimum gate-to-source voltage clamp circuit 200. As shown in FIG. 13, the minimum gate-to-source voltage clamp circuit 200 may include one or more diodes 210 that are coupled in series between the gate terminal 102 and the source terminal 106. As shown, the diodes 210 are coupled cathode-to-anode between the gate terminal 102 and the source terminal 106 such that a cathode of a first one of the diodes 210 is coupled to the gate terminal 102 and an anode of a last one of the diodes 210 is coupled to the source terminal 106. While FIG. 13 illustrates the minimum gate-to-source voltage clamp circuit 200 as including two diodes 210-1, 210-2, it will be appreciated that a single diode 210 or more than two diodes 210 (e.g., three, four, five or more diodes 210) may be included in other embodiments. The diodes 210 may be arranged electrically in series, although embodiments of the invention are not limited thereto.

The minimum gate-to-source voltage clamp circuit 200 acts to clamp the minimum gate-to-source voltage at a predetermined value that corresponds to an inverse of the cumulative reverse voltage drop of the series diodes 210 (i.e., the sum of the reverse voltage drops of the series diodes 210). In particular, if the gate-to-source voltage starts to fall below an inverse of the cumulative forward voltage drop of the series diodes 210 (i.e., because of a change in the voltage applied at the gate terminal 102 and/or because of the above-described dI/dt voltage drop), since the cumulative forward voltage drop of the series diodes 210 will be exceeded, the diodes 210 start to conduct, thereby preventing the gate-to-source voltage from going any lower.

As is further shown in FIG. 13, a parasitic floating p-n diode 220 may be formed between the interconnection of the two diodes 210-1, 210-2 and the drain terminal 104. In addition, the p-type regions of the diodes 210 may, in conjunction with the n-type drift region, also form a parasitic diode 230 between the drain and source terminals 104, 106 that is electrically in parallel to the freewheeling diode $D_{fw}$.

Figure 14A:
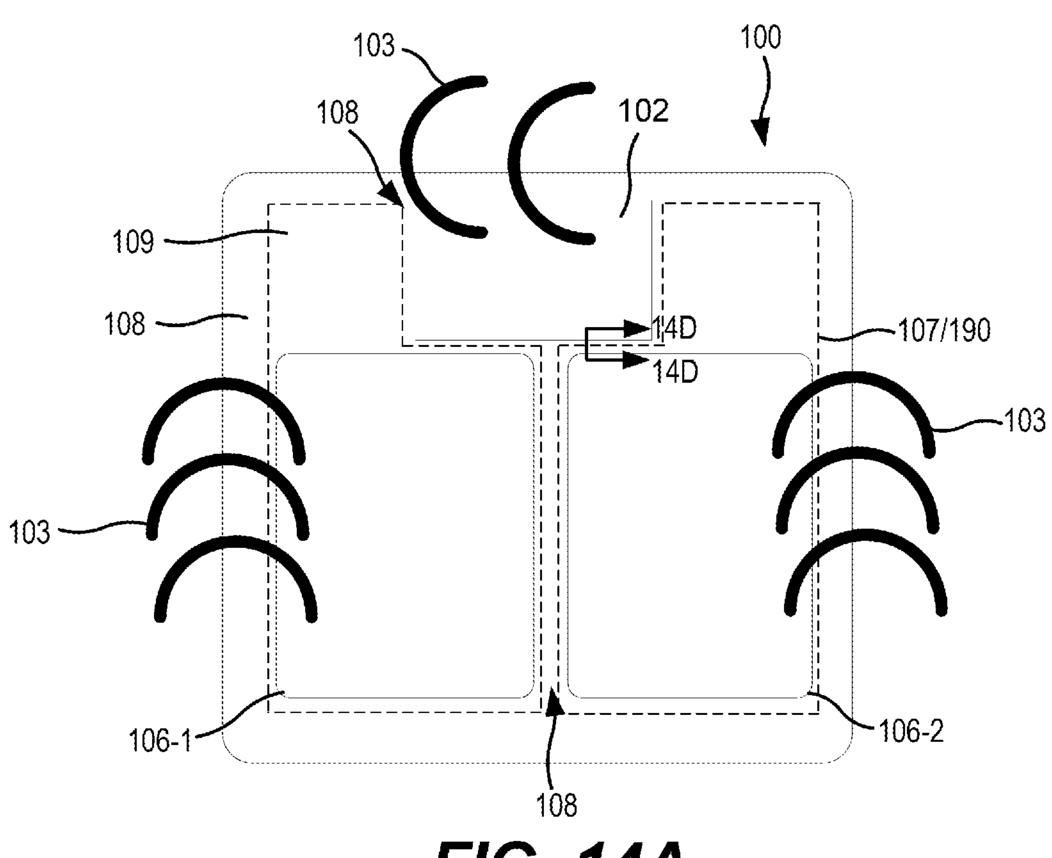
FIG. 14A is a schematic top (plan) view of an implementation of the semiconductor transistor of FIG. 13 where the semiconductor transistor is a silicon carbide power MOSFET.
Figure 14C:
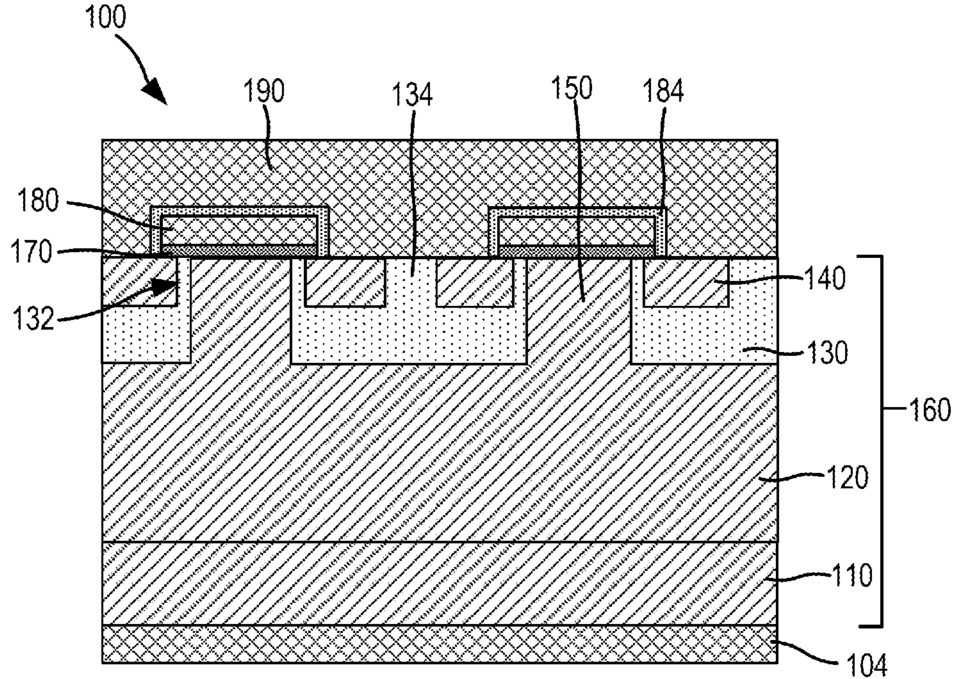
FIG. 14C is a schematic cross-sectional view taken along line 14C-14C of FIG. 14B that illustrates two unit cells of the power MOSFET of FIGS. 14A-14B.
Figure 14B:
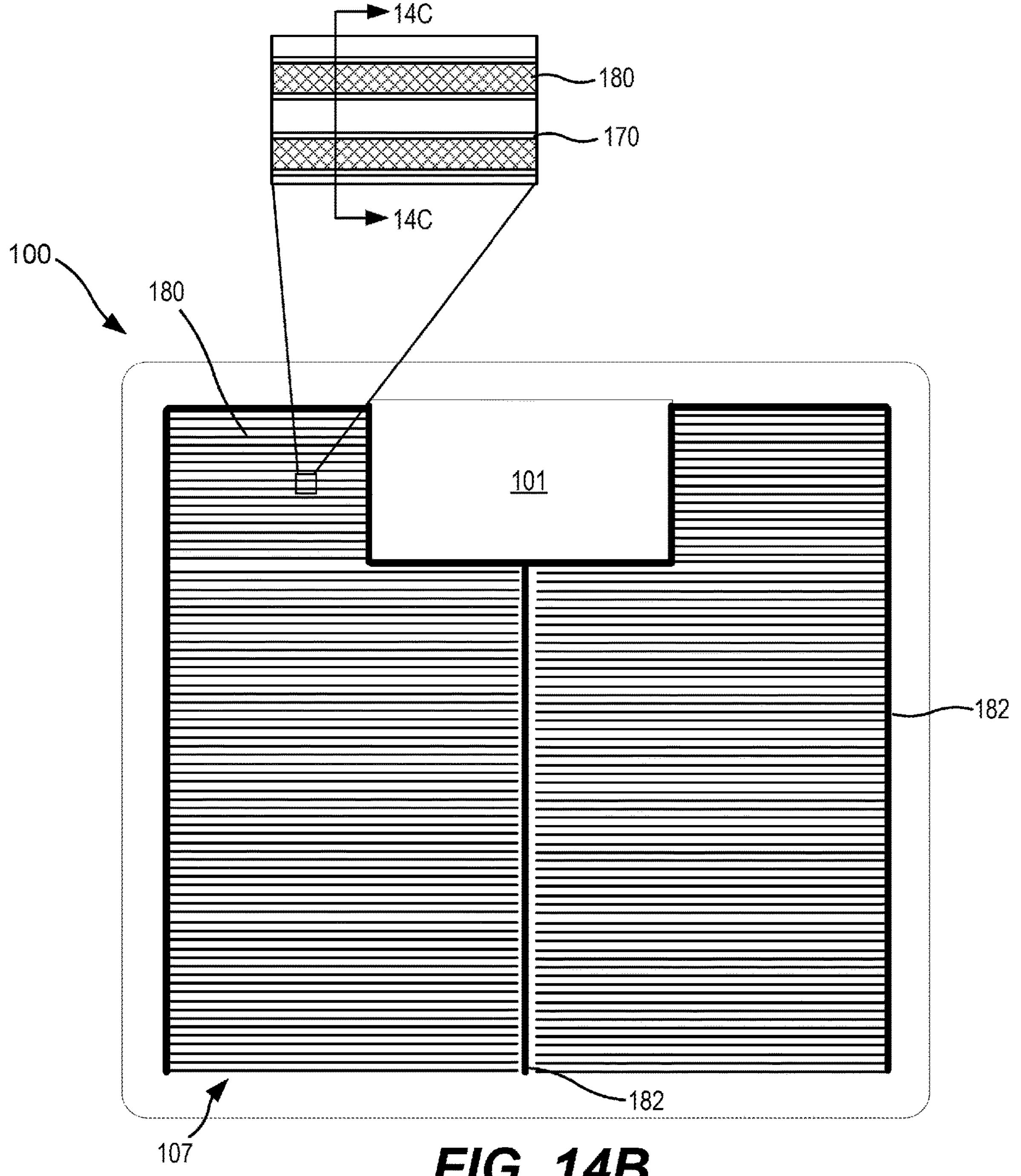
FIG. 14B is a schematic plan view of the power MOSFET of FIG. 14A with various top-side metal and dielectric layers omitted to show the gate fingers and gate buses.
Figures 14D, 15:
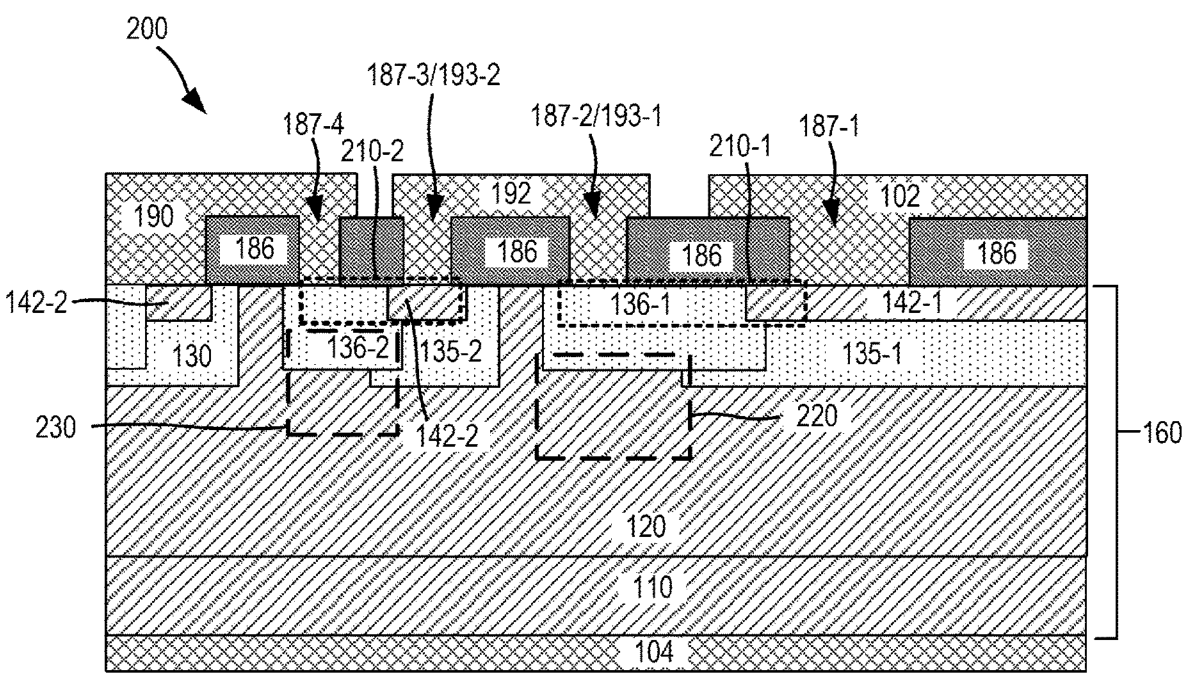
FIG. 14D is a schematic cross-sectional view taken along line 14D-14D of FIG. 14A that illustrates the minimum gate-to-source voltage clamp circuit that is included in the power MOSFET of FIGS. 14A-14B.
FIG. 15 is a graph illustrating the current-voltage (I-V) characteristics of a typical Zener diode.

FIGS. 14A-14D illustrate one possible implementation of the silicon carbide power MOSFET 100. In particular, FIG. 14A is a schematic top (plan) view of the silicon carbide power MOSFET 100, while FIG. 14B is a schematic plan view of the power MOSFET 100 with various top-side metal and dielectric layers thereof omitted to show the gate fingers and gate buses. FIG. 14C is a schematic cross-sectional view taken along line 14C-14C of FIG. 14B that illustrates two unit cells of the power MOSFET 100. Finally, FIG. 14D is a schematic cross-sectional view taken along line 14D-14D of FIG. 14A that illustrates a minimum gate-to-source voltage clamp circuit that is included in the power MOSFET 100. It will be appreciated that the thicknesses of various of the layers, patterns and regions in FIGS. 14A-14D are not necessarily drawn to scale. The same is true with respect to the other figures included in this application.

The power MOSFET 100 includes a semiconductor layer structure 160 (see FIGS. 14C-14D) that comprises one or more semiconductor substrates and/or layers. At least one of the semiconductor layers in the semiconductor layer structure 160 may be a silicon carbide layer. Various metal and/or dielectric layers are formed on either side of the semiconductor layer structure 160 and embedded in the semiconductor layer structure 160.

As shown in FIG. 14A, the top-side metal layers include a gate bond pad 102 and one or more source bond pads 106-1, 106-2 that are formed on the upper side of the semiconductor layer structure 160. A metal drain pad 104 (not visible in FIG. 14A, but see FIGS. 14C-14D below)) is provided on the bottom side of the power MOSFET 100. The gate bond pad 102, the source bond pads 106 and the drain pad 104 form the respective gate, source and drain terminals of power MOSFET die 100. The gate and source pads 102, 106 may each be formed of a metal, such as aluminum, that bond wires can be readily attached to via conventional techniques such as thermo-compression or soldering. The drain pad 104 may likewise be a metal pad. A protective layer 109 such as a polyimide layer may cover the entire upper surface of power MOSFET die 100 except for the gate and source pads 102, 104.

Still referring to FIG. 14A, the power MOSFET 100 includes a source contact 190 (indicated by the dashed boxes in FIG. 14A) that electrically connects certain regions of the semiconductor layer structure 160 to the source bond pads 106-1, 106-2. The source bond pads 106-1, 106-2 may be portions of the source contact 190 that are exposed through openings in the protective layer 109 or may be a separate metal layer. The source contact 190 may generally overlie or correspond to an "active region" 107 of the power MOSFET where the individual unit cell transistors are located. An inactive region 108 of power MOSFET 100 surrounds the active region 107. The inactive region 108 may include a termination region that extends around the periphery of the device that includes guard rings, junction termination elements or other termination structures (not shown), a gate pad region that underlies the gate pad 102, and gate bus regions (discussed below).

Bond wires 103 are shown in FIG. 14A that may be used to connect the gate bond pad 102 and the source bond pads 106 to external circuits or the like. The drain pad 104 on the bottom side of power MOSFET 100 may be connected to an external circuit through, for example, an underlying submount (not shown) such as a lead frame, a heat sink, a power substrate or the like.

FIG. 14B is another plan view of power MOSFET 100 with the gate and source bond pads 102, 106, the polymide layer 109, the source contact 190 and various intermetal dielectric layers removed to show gate fingers 180 that are formed in the semiconductor layer structure 160. As shown in FIG. 14B, a field oxide layer 101 is formed on the semiconductor layer structure 160. The field oxide layer 101 may be a relatively thick oxide layer (e.g., ten to twenty times thicker than the gate oxide layers that are discussed below) and may be formed in the region where the gate bond pad 102 is formed so that the gate bond pad 102 vertically overlaps the field oxide layer 101. As used herein, two elements of a semiconductor device are considered to "vertically overlap" if an axis that is perpendicular to the major surfaces of a semiconductor layer structure of the semiconductor device intersects both elements. One or more gate buses 182 are provided that extend around the periphery of the active region 107. The field oxide layer 101 may also run underneath (and vertically overlap) each gate bus 182. The gate buses 182 are electrically connected to the gate bond pad 102, often through gate resistors (not shown). A plurality of gate fingers 180 are formed on the semiconductor layer structure 160 throughout the active region 107. In the depicted MOSFET, the gate fingers 180 extend horizontally across the semiconductor layer structure 160. In other cases, the gate fingers 180 may extend vertically across the semiconductor layer structure 160, both horizontally-extending and vertically-extending gate fingers 180 can be provided to form a grid-like gate fingers structure, or annular hexagonal or other-shaped gate fingers 180 may be used. The gate fingers 180 may be connected to the gate pad 102 through the gate buses 182. The gate fingers 180 may comprise, for example, a doped polysilicon pattern. The gate buses 182 may comprise doped polysilicon and/or metal structures in example embodiments and typically are in the inactive region 108 of power MOSFET 100.

As shown in FIG. 14C, the power MOSFET 100 includes an n-type silicon carbide semiconductor substrate 110. The substrate 110 may comprise, for example, a single crystal 4H silicon carbide semiconductor substrate that is heavily-doped with n-type impurities (i.e., an n+ silicon carbide substrate). The substrate 110 may have an n-type dopant concentration of, for example, between $1\times10^{18}$ atoms/$cm^3$ and $1\times10^{21}$ atoms/$cm^3$, although other doping concentrations may be used. The substrate 110 may be relatively thick in some embodiments (e.g., 20-100 microns or more). It should be noted that while the substrate 110 is are depicted as a relatively thin layer, this is done to allow enlarging the thickness of other layers and regions, and it will be appreciated that the substrate 110 will typically be much thicker than shown. The thickness of various other layers of power MOSFET 100 likewise may not be shown to scale in order to allow other portions of the devices to be enlarged in the figures A lightly-doped n-type (n-) silicon carbide drift layer 120 is provided on an upper surface of the substrate 110. Typically, the drift layer 120 is formed via an epitaxial growth process and is doped during growth. The n-type drift region 120 may have, for example, a doping concentration of $5\times10^{15}$ to $5\times10^{17}$ dopants/$cm^3$. The n-type drift region 120 may be a thick region, having a vertical height above the substrate 110 of, for example, 3-50 microns, and can be doped during growth. While not shown in FIG. 14C, in some cases the upper portion of the n-type drift region 120 may be more heavily doped than the lower portion of the n-type drift region 120 so as to form an n-type current spreading layer in the upper portion of the n-type drift region 120. If provided, the n-type current spreading layer may have an n-type dopant concentration of, for example, $5\times10^{16}$ to $1\times10^{18}$.

Moderately-doped p-type silicon carbide well regions 130 are provided in the upper surface of the n-type drift region 120. The p-type silicon carbide well regions 130 may be formed by implanting p-type dopants into some or all of the upper portion of the n-type silicon carbide drift layer 120. In example embodiments, each moderately-doped p-type well region 130 may have a p-type dopant concentration of, for example, $5\times10^{16}$ to $1\times10^{18}$. Channel regions 132 are defined in outer portions of each p-type well region 130.

Heavily-doped (n+) n-type silicon carbide source regions 140 may be formed in upper portions of the p-type silicon carbide well regions 130. Each heavily-doped n-type silicon carbide source region 140 may have a doping concentration, for example, of between $1\times10^{19}$ atoms/cm$^3$ and $5\times10^{21}$ atoms/cm$^3$. The n-type silicon carbide source regions 140 may be formed by ion implantation. Two source regions 140 may be formed in each p-type well region 130. A middle portion 134 of the p-type well region 130 that is between the two source regions 134 may extend to the upper surface of the semiconductor layer 160. In some embodiments, this middle portion 134 of each p-type well region 130 may be more heavily doped than other portions of the p-type well region 130 such as, for example, the channel regions 132.

So-called JFET regions 150 are defined between each pair of adjacent p-type silicon carbide well regions 130. The JFET regions 150 are n-type silicon carbide regions and, in some embodiments, may have a higher n-type dopant concentration than the lower portion of the drift layer 120.

The n-type silicon carbide substrate 110, the n-type silicon carbide drift layer 120, the p-type silicon carbide well regions 130, the n-type silicon carbide source regions 140 and the JFET regions 150 may together comprise the semiconductor layer structure 160 of the power MOSFET die 100.

A gate oxide layer 170 is formed on the upper surface of the semiconductor layer structure 160 and patterned appropriately. The gate oxide layer 170 may comprise a plurality of elongated strips of dielectric material such as silicon oxide, silicon nitride, silicon oxynitride or the like. The strips of dielectric material may be connected to each other or may comprise a plurality of disconnected strips. Each gate finger 180 may comprise a strip of conductive material such as a strip of doped polysilicon. Each gate finger 180 may be formed on a respective one of the strips of dielectric material that form the gate oxide layer 170 so that each strip of dielectric material is interposed between a respective one of the gate fingers 180 from the semiconductor layer structure 160 so that the gate fingers 180 are capacitively connected to the semiconductor layer structure 160. Each gate finger 180 vertically overlaps a first source region 140-1, a channel portion 132 of a first p-type well region 130-1, a JFET region 150, a channel portion 132 of a second p-type well region 130-2, and a second source region 140-2. The gate finger 180 vertically overlaps the channel regions 132, so that a channel regions may be inverted during on-state operation to allow current to flow therethrough.

An intermetal dielectric layer 184 covers upper and side surfaces of each gate finger 180. The source contact 190 is formed over the semiconductor layer structure 160 and the intermetal dielectric layer 184. The source contact 190 is galvanically connected to the more heavily doped upper portions 134 of the p-type silicon carbide well regions 130 and to the n-type silicon carbide source regions 140. The intermetal dielectric layer 184 electrically isolates the gate fingers 180 from the source contact 190. The inter-metal dielectric pattern 184 may, for example, comprise one or more of a silicon oxide pattern, a silicon nitride pattern, an aluminum oxide, a magnesium oxide or mixtures of these or other oxides and nitrides with silicon dioxide to form silicate or oxy-nitride alloyed dielectrics.

The power MOSFET 100 may be turned on by applying a gate voltage that is above a threshold level to the gate pad 102. The gate voltage is transferred to the gate fingers 180 via the gate buses 182 and creates conductive n-type inversion layers in the p-type channel regions 132, thereby allowing current to flow from the source contact 190, through the source regions 140, the channel regions 132, and the JFET regions 150 to the drift layer 120 and the substrate 110, which together act as a common drain region for the power MOSFET 100.

FIG. 14D is a schematic cross-sectional view taken along line 14D-14D of FIG. 14A that illustrates a minimum gate-to-source voltage clamp circuit 200 that is included in the power MOSFET 100. As can be seen with reference to FIG. 14A, in the depicted embodiment the minimum gate-to-source voltage clamp circuit 200 is implemented in between the gate pad 102 and the source contact 190. It will be appreciated, however, that the minimum gate-to-source voltage clamp circuit 200 may be implemented in other locations of the power MOSFET 100 such as, for example, in between one the gate buses 182 and the source contact 190.

As shown in FIG. 14D, a first auxiliary p-type well region 135-1 may be provided in an upper portion of the semiconductor layer structure 160 underneath the gate pad 102. A first highly-doped n-type region 142-1 is formed at least partly in the first auxiliary p-type well region 135-1. An interlayer dielectric pattern 186 is formed between the gate pad 102 and the semiconductor layer structure 160. The gate pad 102 extends through a first opening 187-1 in the interlayer dielectric pattern 186 to contact the first highly-doped n-type region 142-1.

A first highly-doped p-type region 136-1 is formed in an upper portion of the semiconductor layer structure 160 to contact the first highly-doped n-type region 142-1. The first highly-doped p-type region 136-1 and the first highly-doped n-type region 142-1 together form a first diode 210-1 of the minimum gate-to-source voltage clamp circuit 200.

A metal connector 192 is formed on an upper surface of the semiconductor layer structure 160 between the gate pad 102 and the source contact 190. As shown, the metal connector 192 does not directly contact either the gate pad 102 or the source contact 190. The metal connector 192 includes a first contact region 193-1 that extends through a second opening 187-2 in the intermetal dielectric pattern 186 to directly contact the first highly-doped p-type region 136-1. A second auxiliary p-type well region 135-2 is provided in the upper portion of the semiconductor layer structure 160 underneath the auxiliary metal pad 192. A second highly-doped n-type region 142-2 is formed in the second auxiliary p-type well region 135-2. A second highly-doped p-type region 136-2 is also at least partly formed in the second auxiliary p-type well region 135-2. The second highly-doped p-type region 136-2 and the second highly-doped n-type region 142-2 together form a second diode 210-2 of the minimum gate-to-source voltage clamp circuit 200. The metal connector 192 includes a second contact region 193-2 that extends through a third opening 187-3 in the intermetal dielectric pattern 186 to directly contact the second highly-doped n-type region 142-2. Thus, the metal connector 192 electrically connects the first highly-doped p-type region 136-1 of the first diode 210-1 to the second highly-doped n-type region 142-2 of the second diode 210-2.

The second highly-doped p-type region 136-2 extends underneath the source contact 190, which directly contacts the second highly-doped p-type region 136-2 through a fourth opening 187-4 in the interlayer dielectric layer 186. Thus, the first and second diodes 210-1, 210-2 and the metal connector 192 electrically connect the gate pad 102 to the source contact 190. The diodes 210-1, 210-2 form the minimum gate-to-source voltage clamp circuit 200.

The diodes 210-1, 210-2 may be implemented as Zener diodes. As is well known in the art, a Zener diode refers to a diode that operates as a normal diode for current flow in the forward direction (i.e., current flow from anode to cathode), and that also allows current to flow in the reverse direction when a certain reverse voltage is applied across the diode. Typically (but not always), a Zener diode is designed so that when the reverse voltage reaches a certain level, the diode will experience a non-destructive form of avalanche breakdown in the reverse direction, allowing reverse current flow through the Zener diode. A typical silicon carbide Zener diode may have a forward voltage drop of about 3 volts and a reverse voltage drop of between −10 and −50 volts. FIG. 15 is a graph illustrating the current-voltage (I-V) characteristics of a typical silicon carbide Zener diode. As shown, when a forward voltage of about 3 volts is applied, the Zener diode starts to conduct in the forward direction. Since two Zener diodes 210-1, 210-2 are arranged in series in the minimum gate-to-source voltage clamp circuit 200 of FIG. 14D, current will start to conduct in the forward direction from the source contact 190 to the gate pad 102 when the gate-to-source voltage falls below −6 volts. This source-to-gate current reduces the gate-to-source voltage drop, and hence the Zener diodes 210-1, 210-2 act to clamp the minimum gate-to-source voltage at about −6 volts.

Referring again to FIGS. 13 and 14D, a parasitic floating p-n diode 220 is formed in the semiconductor layer structure 160 between the drain terminal 110 and the metal connector 192. As shown in FIG. 13, this parasitic diode connects to a node where Zener diode 210-1 connects to Zener diode 210-2. The parasitic floating p-n diode 124 is formed by the connection between the highly-doped p-type region 136-1 and the drift region 120, as is shown in FIG. 14D. The spacing between the floating p-type well region 135-1 and the surrounding source connected p-type well regions 130 may be designed to not cause drain breakdown during reverse bias operation.

In addition, a parasitic source-to-drain diode 230 is formed by the highly-doped p-type region 136-2 and the drift region 120, as is shown in FIG. 14D. The parasitic source-to-drain diode 230 may marginally add to the source-to-drain capacitance, which is generally undesirable. However, the increase in the source-to-drain capacitance may be sufficiently small so as to not be problematic.

Referring again to FIG. 13, it can be seen that back-to-back diodes 210-2 and 220 are coupled between the gate pad 102 and the drain pad 104 and hence add to the gate-to-drain capacitance of the power MOSFET 100. Similarly, series diodes 210-1, 210-2 are coupled between the source pads 106 and the gate pad 102, and thus add to the gate-to-source capacitance of the power MOSFET 100. Increases in the gate-to-drain capacitance and/or the gate-to-source capacitance of a power MOSFET are generally undesirable. However, the area of the minimum gate-to-source voltage clamp circuit 200 on the die may be set based on the amount of current that needs to be sunk during the gate-to-source voltage clamping operation. This clamping current may be small compared to the currents passed by the power MOSFET 100 during on-state operation, and hence the minimum gate-to-source voltage clamp circuit 200 may only take up a small amount of the active area of the die. Thus, the area of the minimum gate-to-source voltage clamp circuit (when the semiconductor die is viewed from above in plan view) may, for example, be less than 10%, less than 5%, less than 3%, less than 2% or even less than 1% the corresponding area of the active region of the MOSFET 100. Thus, while the minimum gate-to-source voltage clamp circuit 200 may increase the gate-to-drain capacitance and/or the gate-to-source capacitance of the power MOSFET 100, these may only be small increases due to the limited die area occupied by the minimum gate-to-source voltage clamp circuit 200.

The power MOSFET 100 can be manufactured using conventional processing techniques and may not require any additional processing steps. For example, the metal connector 192 may be part of the same metallization layer that is used to form the gate pad 102 and the source contact 190. This metallization layer may, for example, be deposited conformally on the semiconductor layer structure 160 and then patterned to form the gate pad 102, the source pads 106, the gate buses 182 and the metal connector 192. The first and second auxiliary p-type well regions 135-1, 135-2 may be formed in the same ion implantation step that is used to form the p-type well regions 130 in the active region 107 of the MOSFET 100. The first and second highly-doped p-type regions 136-1, 136-2 may be formed in the same ion implantation step that is used to form the highly-doped regions 134 that are provided in the upper portions of the p-type well regions 130. Finally, the first and second highly-doped n-type regions 142-1, 142-2 may be formed in the same ion implantation step that is used to form the n-type source regions 140 in the active region 107 of the power MOSFET 100.

Thus, as described above, pursuant to some embodiments of the present invention, transistors 100 are provided that include a silicon carbide based semiconductor layer structure 160, a gate terminal 102, a first current terminal 104, and a second current terminal 106. The first and second current terminals 104, 106 are on opposed major surfaces of the semiconductor layer structure 160. These transistors 100 further include a minimum gate terminal-to-second current terminal voltage clamp circuit 200 in the semiconductor layer structure 160 that is coupled between the gate terminal 102 and the second current terminal 106.

The minimum gate terminal-to-second current terminal voltage clamp circuit 200 includes first and second diodes 210-1, 210-2. The cathodes of the diodes 210-1, 210-2 are coupled to the gate terminal 102 while the anodes of the diodes 210-1, 210-2 are coupled to the second current terminal 106. The diodes 210-1, 210-2 are bidirectional diodes such as, for example, Zener diodes.

The semiconductor layer structure 160 may comprise a drift region 120 having a first conductivity type (e.g., n-type), a first well region 135-1 having a second conductivity type (e.g., p-type) in an upper portion of the drift region 120, a first implanted region 142-1 at least partially in the first well region 135-1, the first implanted region 142-1 having the first conductivity type, and a second implanted region 136-1 that has the second conductivity type. The first and second implanted regions 142-1, 136-1 may comprise the first diode 210-1. The first implanted region 142-1 may directly contact a gate structure (e.g., the gate pad 102 or a gate bus 182) that is electrically connected to the gate terminal 102 and/or the second implanted region 136-1 may directly contact a metal connector 192 that is between the gate structure and a source/drain contact 190 that is electrically connected to the second current terminal 106.

The semiconductor layer structure 160 may also include a second well region 135-2 having the second conductivity type in the upper portion of the drift region 120, a fifth implanted region 142-2 in the second well region 135-2, the fifth implanted region 142-2 having the first conductivity type, and a sixth implanted region 136-2 that is at least partially in the second well region 135-2, the sixth implanted region 136-2 having the second conductivity. The fifth and sixth implanted regions 142-2, 136-2 may comprise the second diode 210-2. The fifth implanted region 142-2 may directly contact the metal connector 192 and the sixth implanted region 136-2 may directly contact the source/drain contact 190. The second diode 210-2 may at least partially vertically overlap the metal connector 192. The second implanted region 136-1 may have a doping concentration that is at least an order of magnitude greater than a doping concentration of the first well region 135-1, and the sixth implanted region 136-2 may have a doping concentration that is at least an order of magnitude greater than a doping concentration of the second well region 135-2.

One potential shortcoming of the MOSFET 100 is that the p-n junctions of the Zener diodes 210-1, 210-2 may be leakier than desired when the MOSFET 100 operates in its on-state. This may especially be true when the MOSFET 100 is operating at high temperature. During on-state operation, the gate voltage may be, for example, about 15 volts. At such a voltage some current may leak from the gate terminal 102 to the source terminal 106. Such gate leakage current may be undesirable as it may increase power loss.

Figures 16A, 16B:
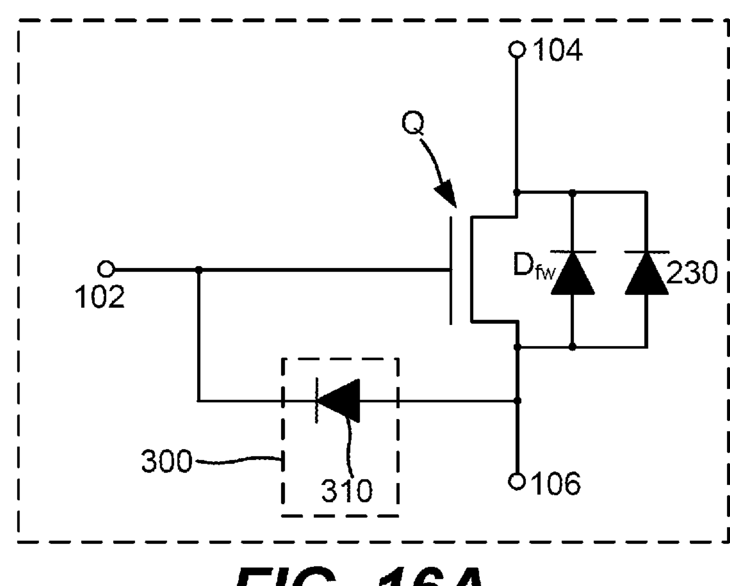
FIG. 16A is a schematic circuit diagram of a minimum gate-to-source voltage clamp circuit according to further embodiments of the present invention.
FIG. 16B is a schematic cross-sectional view the minimum gate-to-source voltage clamp circuit of FIG. 16A.

FIG. 16A is a schematic circuit diagram of a power MOSFET that includes a minimum gate-to-source voltage clamp circuit 300 according to further embodiments of the present invention. FIG. 16B is a schematic cross-sectional view the minimum gate-to-source voltage clamp circuit 300. The power MOSFET of FIG. 16A may have the same design as the power MOSFET 100 of FIGS. 14A-14D except that it includes minimum gate-to-source voltage clamp circuit 300 in place of the minimum gate-to-source voltage clamp circuit 200 that is included in the power MOSFET die 100. The cross-section of FIG. 16B is taken along line 14D-14D of FIG. 14A.

As shown in FIG. 16A, the minimum gate-to-source voltage clamp circuit 300 includes a single diode 310 that is coupled between the gate pad 102 and the source contact 112. The minimum gate-to-source voltage clamp circuit 300 also includes the parasitic source-to-drain diode 230. Parasitic source-to-drain diode 230 may be identical to the parasitic source-to-drain diode 230 discussed above with reference to FIGS. 13 and 14D, and hence further description thereof will be omitted here. The parasitic diode 220 of the minimum gate-to-source voltage clamp circuit 200 is not present in the minimum gate-to-source voltage clamp circuit 300.

Referring to FIG. 16B, the minimum gate-to-source voltage clamp circuit 300 may be similar to the minimum gate-to-source voltage clamp circuit 200 of MOSFET 100, but only includes a single diode 310 that is coupled anode-to-cathode between the source terminal 106 (which is electrically connected to the source contact 190) and the gate pad 102. The minimum gate-to-source voltage clamp circuit 300 includes an auxiliary p-type well region 335 that is formed in an upper portion of the semiconductor layer structure 160 underneath the gate pad 102 and may be identical or similar to the first auxiliary p-type well region 135-1 of the minimum gate-to-source voltage clamp circuit 200. The auxiliary p-type well region 335 may be electrically floating, but close to the gate potential. A highly-doped n-type region 342 is formed at least partially in the auxiliary p-type well region 335 and may be identical or similar to the first highly-doped n-type region 142-1 of the minimum gate-to-source voltage clamp circuit 200. An interlayer dielectric pattern 386 is formed between the gate pad 102 and the semiconductor layer structure 160. The gate pad 102 extends through a first opening 387-1 in the interlayer dielectric pattern 386 to contact the highly-doped n-type region 342.

A highly-doped p-type region 336 is formed in an upper portion of the semiconductor layer structure 160 underneath the source contact 190 and the interlayer dielectric pattern 386. The source contact 190 extends through a second opening 387-2 in the interlayer dielectric pattern 386 to contact the highly-doped p-type region 336. A lightly-doped p-type region 338 is formed in the upper portion of the semiconductor layer structure 160 between the auxiliary p-type well region 335 and the highly-doped p-type region 336. The lightly-doped p-type region 338 may have a doping concentration of, for example, between $5\times10^{16}$ atoms/cm$^3$ and $1\times10^{18}$ atoms/cm$^3$. The highly-doped n-type region 342, a portion of the auxiliary p-type well region 335, the lightly-doped p-type region 338 and the highly-doped p-type region 336 together form the diode 310 of the minimum gate-to-source voltage clamp circuit 300. The diode 310 is interposed on the electrical path between the gate pad 102 and the source contact 190.

The diode 310 may be a Zener diode or other type of bidirectional diode. The diode 310 is constructed so that the highly-doped p-type region 336 is electrically connected to the highly-doped n-type region 342 via (1) the lightly-doped p-type region 338 and (2) a portion of the auxiliary p-type well region 335. In some cases, the auxiliary p-type well region 334 may not extend past the left edge of the highly-doped n-type region 342 so that the lightly-doped p-type region 338 directly connects the highly-doped n-type region 342 to the highly-doped p-type region 336. The length of the lightly-doped p-type region 338 in a direction extending between the highly-doped n-type region 342 and the highly-doped p-type region 336 may be selected to set the forward voltage drop of the diode 310. In particular, since the lightly-doped p-type region 338 will have a substantially higher resistance than the other regions forming the diode 310 the voltage drop across the lightly-doped p-type region 338 may be used to increase the forward voltage drop of diode 322. The diode 310 may be configured to have a forward voltage drop of, for example, somewhere between −8 volts and −5 volts in example embodiments in order to clamp the minimum gate-to-source voltage to a desired value between −8 volts and −5 volts. The diode 310, which includes the lightly-doped p-type region 338, is expected to be less leaky during on-state operation (at a gate bias voltage of, for example, 15 volts) than the diodes 210-1, 210-2 included in the minimum gate-to-source voltage clamp circuit 200 of MOSFET 100 because there will be less Zener action in reverse bias from the highly-doped n-type region 342 to the lightly-doped p-type region 338.

A deep p-type well region 339 is provided in the semiconductor layer structure 160 underneath the gate pad 102 and below the auxiliary p-type well region 335. The deep p-type well region 339 may be formed through an additional masked ion implantation step and may act as a deep shield region. The deep p-type well region 339 may be provided so that when a large voltage is applied to the drain terminal 104 (as may be the case when the MOSFET operates in reverse blocking mode), a parasitic n-p-n bipolar junction transistor 344 that is formed in the semiconductor layer structure 160 between the highly-doped n-type region 342, the auxiliary p-type well region 335, the lightly-doped p-type region 338 and the n-type drift region 120 may turn on, which results in current conduction between the source and drain terminals even when an off-state voltage is applied to the gate terminal. In other words, the parasitic bipolar junction transistor 344 may cause the MOSFET to turn on when it is supposed to be off. The parasitic bipolar junction transistor 344 may also lead to positive feedback with localized temperature, which can potentially cause thermal runaway that could destroy the MOSFET. The deep p-type well region 339 may be doped to a sufficiently high level so that recombination in the p-type base region is high enough so that the parasitic bipolar junction transistor will not turn on.

As shown in FIG. 16B, the deep p-type well region 339 may extend a distance "y" past an edge of the lightly-doped p-type region 338 toward the highly-doped p-type region 336 (i.e., the deep p-type well region 339 vertically overlaps the lightly-doped p-type region 338 for the distance "y"). The distance y is preferably large enough so that the above-described parasitic bipolar junction transistor 344 will not turn on. The lateral distance between deep p-type well region 339 and the highly-doped p-type region 336 is a distance "x." The distance x+y is preferably large enough so that the reverse voltage drop of the diode 322 can be set to a desired value and the base of the parasitic bipolar junction transistor 344 can be sufficiently resistive to keep the parasitic bipolar junction transistor 344.

Thus, as described with respect to FIGS. 16A-16B, pursuant to further embodiments of the present invention, transistors are provided that include a silicon carbide based semiconductor layer structure 160, a gate terminal 102, a first current terminal 104, and a second current terminal 106. The first and second current terminals 104, 106 are on opposed major surfaces of the semiconductor layer structure 160. These transistors 100 further include a minimum gate terminal-to-second current terminal voltage clamp circuit 300 in the semiconductor layer structure 160 that is coupled between the gate terminal 102 and the second current terminal 106. The minimum gate terminal-to-second current terminal voltage clamp circuit 300 includes a single diode 310 (e.g., a Zener diode) The cathode of diode 310 is coupled to the gate terminal 102 while the anode of diode 310 is coupled to the second current terminal 106.

The semiconductor layer structure 160 includes a drift region 120 having a first conductivity type (e.g., n-type), a first well region 335 having a second conductivity type (e.g., p-type) in an upper portion of the drift region 120, a first implanted region 342 in the first well region 335, the first implanted region 342 having the first conductivity type, a second implanted region 336 that has the second conductivity type, and a third implanted region 338 that has the second conductivity type with a doping concentration that is less than a doping concentration of the first well region 335. The third implanted region 335 is interposed between the first implanted region 342 and the second implanted region 336. The first through third implanted regions 342, 336, 338 comprise the diode 310. The first implanted region 342 may directly contact a gate structure (e.g., the gate pad 102 or a gate bus 182) that is electrically connected to the gate terminal 102.

The semiconductor layer structure 160 may also comprise a fourth implanted region 339 that has the second conductivity type, where the gate structure, the first implanted region 342, the first well region 335 and the third implanted region 338 all vertically overlap the fourth implanted region 339. The fourth implanted region 339 may be in between the drift region 120 and the first implanted region 342. In some cases, the fourth implanted region 339 may extend laterally beyond the first well region 335 toward the second implanted region 336 by a distance y, where y is large enough to prevent a parasitic bipolar junction transistor that comprises at least the first implanted region 342, the first well region 335 and the drift region 120 from turning on during normal operation of the transistor 300. Moreover, a lateral width of the fourth implanted region 339 may be selected so that a forward voltage drop of the diode 310 has a preselected value.

Figure 17A:
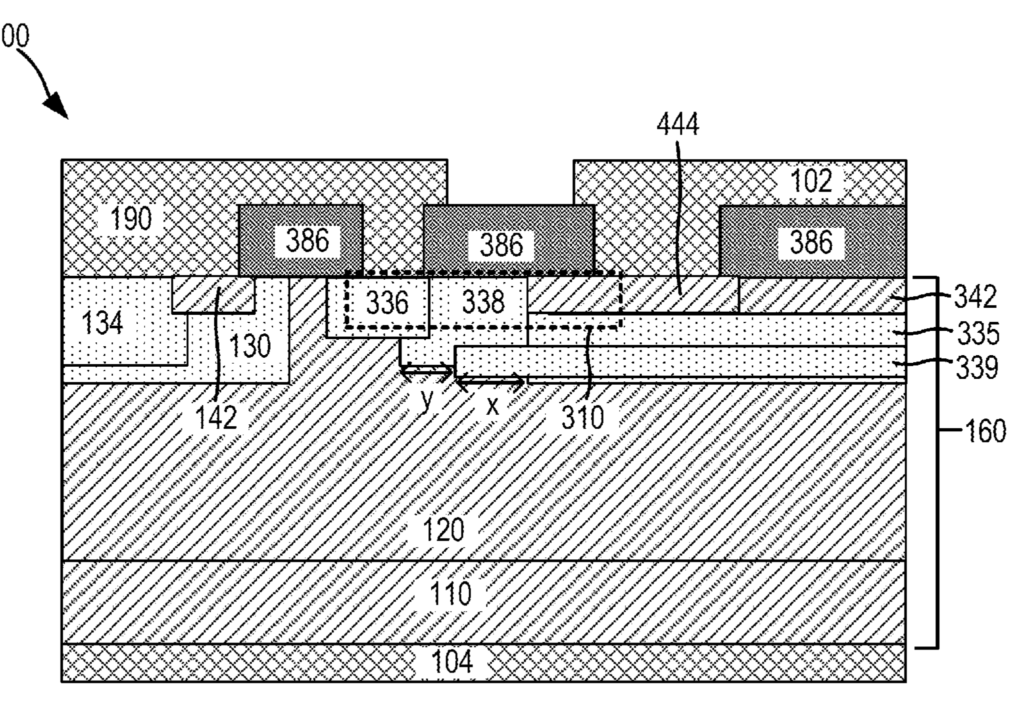
FIG. 17A is a schematic cross-sectional view of a minimum gate-to-source voltage clamp circuit that is a modified version of the minimum gate-to-source voltage clamp circuit of FIG. 16B.

FIG. 17A is a schematic cross-sectional view of a power MOSFET that illustrates a minimum gate-to-source voltage clamp circuit 400 according to further embodiments of the present invention that is a modified version of the minimum gate-to-source voltage clamp circuit 300 of FIG. 16B. The minimum gate-to-source voltage clamp circuit 400 of FIG. 17A may be identical to the minimum gate-to-source voltage clamp circuit 300 of FIG. 16B except that the portion 444 of the highly-doped n-type region 342 that contacts the gate pad 102 is counter-doped with p-type dopants to reduce the effective doping concentration of this portion 444 of the highly-doped n-type region 342. The n-type dopant concentration in this counter-doped region 444 exceeds the p-type doping concentration, so the counter-doped region 444 will have n-type conductivity. The lower n-type doping concentration in this counter-doped region 444 acts to weaken the emitter injection efficiency of the parasitic bipolar junction transistor 344 described above with reference to FIG. 16B. The reduced n-type doping concentration (due to the counter-doping) increases the contact resistance of the gate contact 102 to the highly-doped n-type region 342/444, but the effect of this additional resistance, which is electrically in series with the lightly-doped p-type region 338, can be managed by shortening the length of the lightly-doped p-type region 338.

Figure 17B:
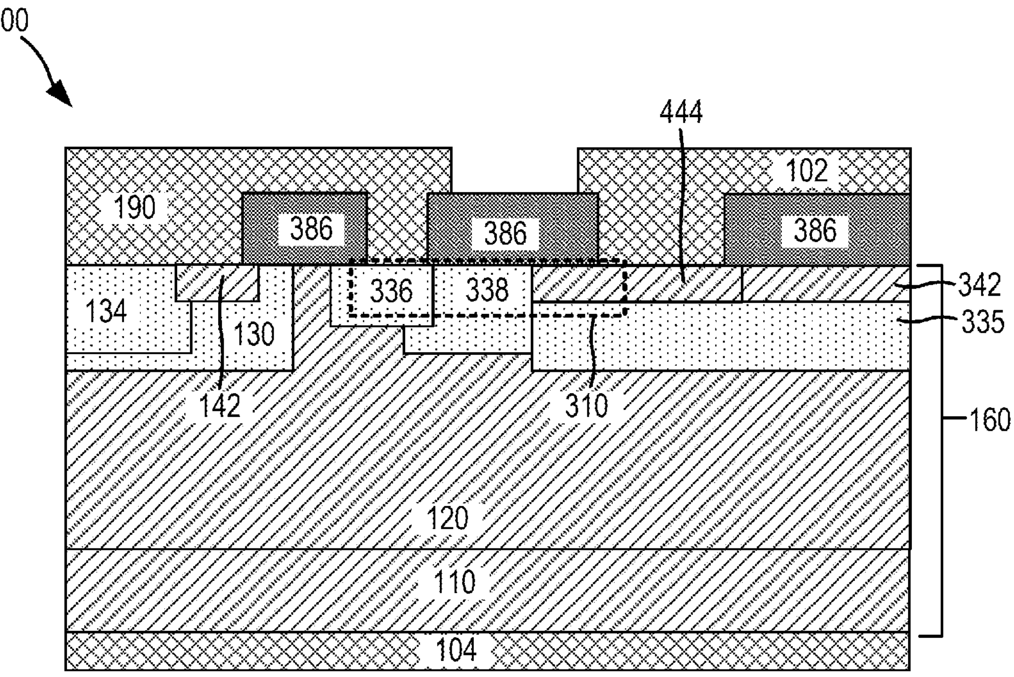
FIG. 17B is a schematic cross-sectional view of a minimum gate-to-source voltage clamp circuit that is another modified version of the minimum gate-to-source voltage clamp circuit of FIG. 16B.

FIG. 17B is a schematic cross-sectional view of a power MOSFET that illustrates a minimum gate-to-source voltage clamp circuit 500 according to further embodiments of the present invention that is a modified version of the minimum gate-to-source voltage clamp circuit 400 of FIG. 17A. The minimum gate-to-source voltage clamp circuit 500 shown in FIG. 17B omits the deep p-type well region 339 but otherwise is identical to the minimum gate-to-source voltage clamp circuit 400 of FIG. 17A and hence further description thereof will be omitted.

Figure 18:
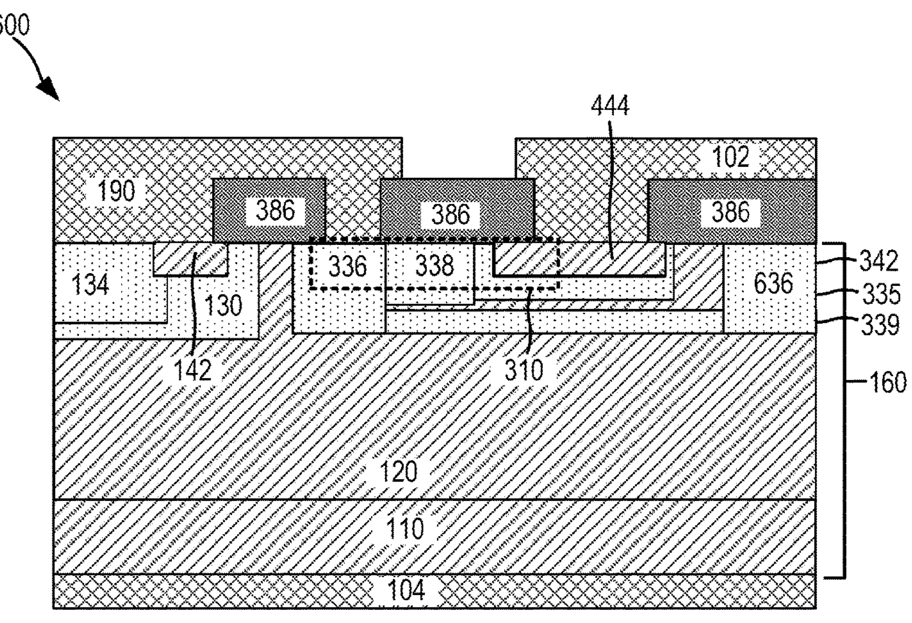
FIG. 18 is a schematic cross-sectional view of a minimum gate-to-source voltage clamp circuit that is another modified version of the minimum gate-to-source voltage clamp circuit of FIG. 16B.

FIG. 18 is a schematic cross-sectional view of a power MOSFET that illustrates a minimum gate-to-source voltage clamp circuit 600 according to further embodiments of the present invention. The minimum gate-to-source voltage clamp circuit 600 is a modified version of the minimum gate-to-source voltage clamp circuit 300 of FIG. 16B. The minimum gate-to-source voltage clamp circuit 600 includes a full junction isolation by configuring the deep p-type well region 339 to connect to the highly-doped p-type region 336 to a second highly-doped p-type region 636 so that the diode 310 is fully isolated from the drain contact 106 by a p-type region formed by the deep p-type well region 339, the highly-doped p-type region 336, and the highly-doped p-type region 636. The size and shapes of various of the other implanted regions may be changed from those shown in the minimum gate-to-source voltage clamp circuit 300, as shown in FIG. 18.

Figure 19:
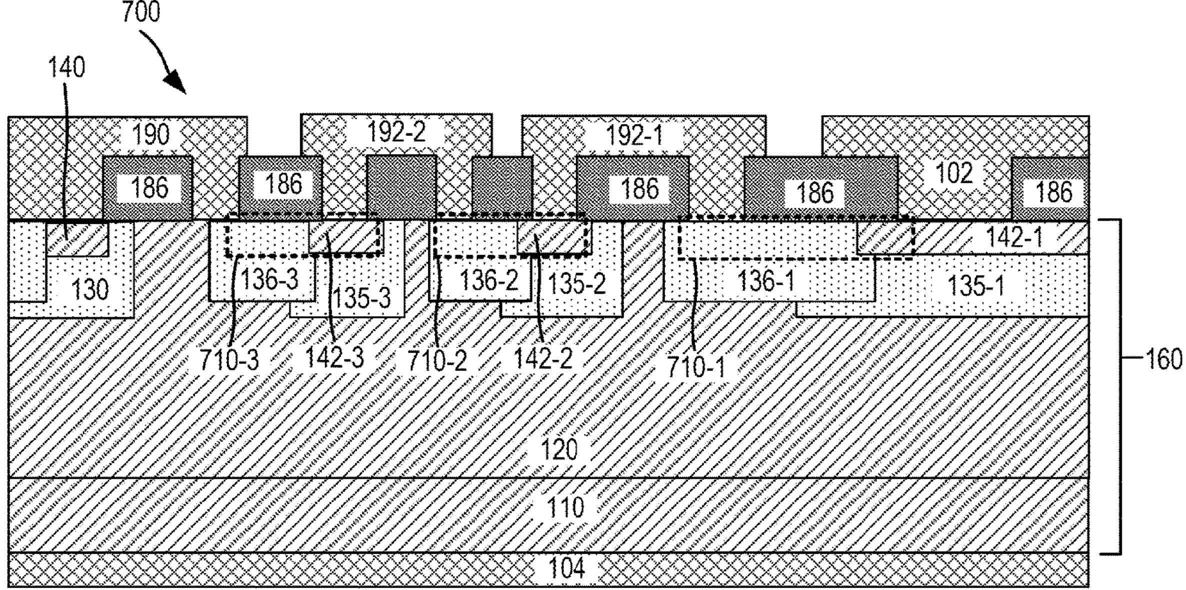
FIG. 19 is a schematic cross-sectional view of a minimum gate-to-source voltage clamp circuit that is a modified version of the minimum gate-to-source voltage clamp circuit of FIG. 14D.

FIG. 19 is a schematic cross-sectional view of a power MOSFET that illustrates a minimum gate-to-source voltage clamp circuit 700 according to further embodiments of the present invention. The minimum gate-to-source voltage clamp circuit 700 that is a modified version of the minimum gate-to-source voltage clamp circuit 200 of FIG. 14D. The minimum gate-to-source voltage clamp circuit 700 differs from the minimum gate-to-source voltage clamp circuit 200 in that in includes a total of three Zener diodes 710-1 through 710-3. It will be appreciated that more than three diodes may be provided in further embodiments. An additional metal connector 192 may be provided for each additional Zener diode included in the minimum gate-to-source voltage clamp circuit.

Figure 20:
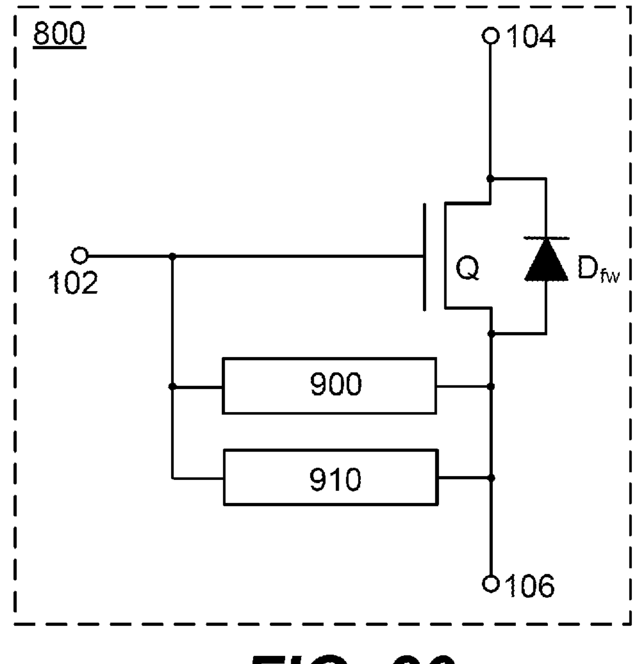
FIG. 20 is a schematic circuit representation of a MOSFET according to further embodiments of the present invention.

FIG. 20 is a schematic circuit representation of a MOSFET 800 according to further embodiments of the present invention. As shown in FIG. 20, the MOSFET includes a control (gate) terminal 102, a first current terminal 104 (which here is a drain terminal) and a second current terminal 106 (which here is a source terminal). A MOSFET Q is formed in a semiconductor layer structure that is galvanically connected to the drain terminal 104 and the source terminal 106 and capacitively connected to the gate terminal 102.

The MOSFET 800 further includes a minimum gate-to-source voltage clamp circuit 900 that is coupled in series between the gate terminal 102 and the source terminal 106. The minimum gate-to-source voltage clamp circuit 900 may have the design of any of the minimum gate-to-source voltage clamp circuits discussed above and hence is shown schematically as a box. For example, the minimum gate-to-source voltage clamp circuit 900 may comprise one or more diodes that are coupled in series cathode-to-anode between the gate terminal 102 and the source terminal 106.

The MOSFET 800 further includes short circuit protection circuitry 910 that is also coupled between the gate terminal 102 and the source terminal 106. The short circuit protection circuitry 910 may have the design of any of the short circuit protection circuitry discussed above and hence is shown schematically as a box. For example, the short circuit protection circuitry 910 may comprise one or more diodes that are coupled in series anode-to-cathode between the gate terminal 102 and the source terminal 106. The minimum gate-to-source voltage clamp circuit 900 may be formed in a first portion of the MOSFET 800 and the short circuit protection circuitry 910 may be formed in a first portion of the MOSFET 800.

The embodiments of the present invention described above implement the minimum gate-to-source voltage clamp circuits in the silicon carbide based semiconductor layer structures of the devices. It will be appreciated, however, that in other embodiments, the minimum gate-to-source voltage clamp circuit may instead be implemented in a separate semiconductor layer such as, for example, a polysilicon layer that is formed on a top surface of the silicon carbide based semiconductor layer structure. In such embodiments the minimum gate-to-source voltage clamp circuit may again be implemented as one or more diodes that are coupled with the cathode side of each diode being coupled to the gate terminal and the anode side of each diode coupled to the source terminal.

Figure 21:
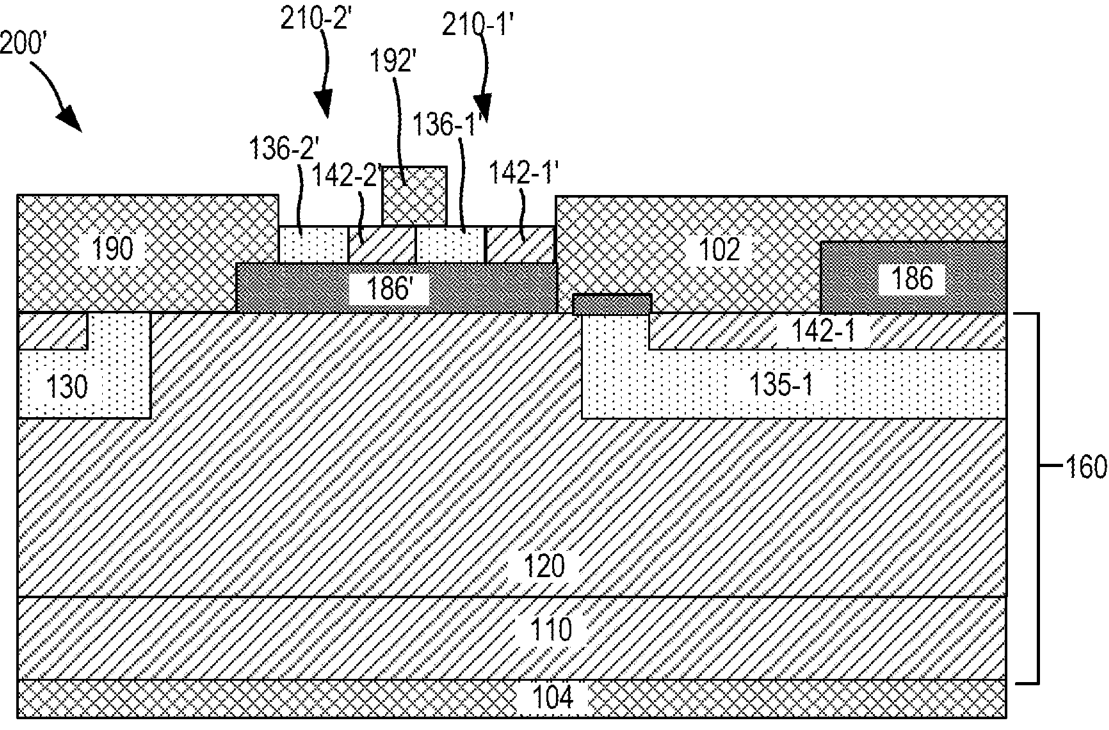
FIG. 21 is a schematic cross-sectional view of a modified version of the power MOSFET of FIGS. 14A-14D that includes an alternative minimum gate-to-source voltage clamp circuit.

As an example, FIG. 21 is a schematic cross-sectional view of a power MOSFET 100' that is a modified version of power MOSFET 100 of FIGS. 14A-14D that includes such an alternative minimum gate-to-source voltage clamp circuit. The cross-section of FIG. 14D is taken along line 14D-14D of FIG. 14A.

As shown in FIG. 21, the power MOSFET 100' is similar to power MOSFET 100, but the first and second diodes 210-1, 210-2 that are implemented in regions 136-1/142-1 and regions 142-2/136-2 in power MOSFET 100 are omitted and replaced with diodes 210-1' and 210-2 that are implemented in a regions 142-1'/136-1' and 142-2'/136-2' in a polysilicon layer 143 that is formed on the upper surface of the silicon carbide semiconductor layer structure 160. A field oxide layer 186' (or other dielectric layer) insulates the polysilicon layer 143 from the silicon carbide semiconductor layer structure 160. As shown, n-type region 142-1' of diode 210-1' may directly connect to the gate pad 102 and the p-type region 136-2' of the second diode 210-2' may directly connect to the source contact 190. A metal connector 192' may electrically connect the first diode 210-1' to the second diode 210-2'. The diodes 210-1', 210-2' form a minimum gate-to-source voltage clamp circuit 200' that is coupled between the gate pad 102 and the source contact 190.

The embodiments set forth above represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The invention claimed is:

1. A transistor, comprising:

a silicon-carbide based semiconductor layer structure;

a first current terminal;

a second current terminal;

a gate terminal; and a minimum gate terminal-to-second current terminal voltage clamp circuit that is coupled between the gate terminal and the second current terminal, wherein the minimum gate terminal-to-second current terminal voltage clamp circuit comprises at least one diode configured to conduct current in response to a gate terminal-to-second current terminal voltage of the transistor decreasing to or below a predetermined value, to thereby limit a further decrease in the gate terminal-to-second current terminal voltage.

2. The transistor of claim 1, wherein the first current terminal and the second current terminal are on opposed major surfaces of the semiconductor layer structure.

3. The transistor of claim 2, wherein a cathode of the at least one diode is coupled to the gate terminal and an anode of the at least one diode is coupled to the second current terminal.

4. The transistor of claim 1, wherein the semiconductor layer structure comprises a drift region, and wherein the at least one diode comprises at least one implanted region comprising silicon carbide in the drift region.

5. The transistor of claim 1, wherein the predetermined value is less than 0 volts.

6. The transistor of claim 2, wherein the at least one diode comprises a single diode, and a forward voltage drop of the single diode corresponds to a voltage to which the minimum gate terminal-to-second current terminal voltage is clamped.

7. The transistor of claim 2, wherein the semiconductor layer structure comprises:

a drift region having a first conductivity type;

a first well region having a second conductivity type in an upper portion of the drift region;

a first implanted region in the first well region, the first implanted region having the first conductivity type; and a second implanted region that has the second conductivity type, wherein the at least one diode comprises a first diode that comprises the first and second implanted regions.

8. The transistor of claim 7, wherein the first implanted region directly contacts a gate structure that is electrically connected to the gate terminal and wherein the second implanted region directly contacts a metal connector that is between the gate structure and a source/drain contact that is electrically connected to the second current terminal.

9. The transistor of claim 8, wherein the at least one diode further comprises a second diode that is formed in the semiconductor layer structure and that at least partially vertically overlaps the floating metal connector.

10. The transistor of claim 9, wherein the semiconductor layer structure further comprises:

a second well region having a second conductivity type in the upper portion of the drift region;

a fifth implanted region in the second well region, the fifth implanted region having the first conductivity type; and a sixth implanted region that is at least partially in the second well region, the sixth implanted region having the second conductivity type, wherein the second diode comprises the fifth and sixth implanted regions.

11. A transistor, comprising:

a silicon-carbide based semiconductor layer structure;

a first current terminal;

a second current terminal that is electrically connected to a first source/drain contact; and a gate structure that includes a gate pad, a plurality of gate fingers, and one or more gate buses that electrically connect at least some of the gate fingers to the gate pad, where the semiconductor layer structure comprises:

a drift region having a first conductivity type;

a first well region having a second conductivity type in an upper portion of the drift region;

a first implanted region comprising silicon carbide in the first well region, the first implanted region having the first conductivity type and directly contacting the gate structure; and a second implanted region comprising silicon carbide in the upper portion of the drift region, the second implanted region having the second conductivity type;

wherein the first and second implanted regions comprise a first diode that is interposed in between the first source/drain contact and the gate structure.

12. The transistor of claim 11, wherein the first diode is coupled anode-to-cathode between the second current terminal and the gate structure.

13. A transistor, comprising:

a silicon-carbide based semiconductor layer structure;

a first current terminal;

a second current terminal;

a gate terminal; and a circuit comprising at least one diode that is coupled anode-to-cathode between the second current terminal and the gate terminal, wherein an absolute value of a reverse breakdown voltage of the at least one diode is greater than a maximum on-state gate terminal-to-second current terminal voltage of the transistor.

14. The transistor of claim 13, wherein the at least one diode is in the silicon-carbide based semiconductor layer structure, and wherein the at least one diode is a single diode and a forward voltage drop of the single diode exceeds 4.5 volts.

15. The transistor of claim 13, wherein the semiconductor layer structure comprises:

a drift region having a first conductivity type;

a first well region having a second conductivity type in an upper portion of the drift region;

a first implanted region in the first well region, the first implanted region having the first conductivity type;

a second implanted region that has the second conductivity type; and a third implanted region that has the second conductivity type and that has a doping concentration that is at least an order of magnitude less than a doping concentration of the second implanted region, where the third implanted region is in between the first implanted region and the second implanted region.

16. The transistor of claim 15, wherein the at least one diode is a single diode that comprises at least portions of the first through third implanted regions.

17. The transistor of claim 15, wherein the semiconductor layer structure further comprises a fourth implanted region that has the second conductivity type and a doping concentration that exceeds a doping concentration of the first well region by at least an order of magnitude, where the gate structure, the first implanted region, the first well region and the third implanted region all vertically overlap the fourth implanted region.

18. The transistor of claim 17, wherein the fourth implanted region is in between the drift region and the first implanted region.

19. The transistor of claim 17, wherein the fourth implanted region extends laterally beyond the first well region toward the second implanted region by a distance y, where y is large enough to prevent a parasitic bipolar junction transistor that comprises at least the first implanted region, the first well region and the drift region from turning on during normal operation of the transistor.

20. The transistor of claim 16, wherein the first implanted region contacts a gate structure of the transistor.

21. The transistor of claim 20, wherein a first portion of the first implanted region that contacts the gate structure is counter-doped with second conductivity type dopants to reduce an effective first conductivity doping concentration of the first portion of the first implanted region.

22. The transistor of claim 13, wherein the at least one diode comprises a plurality of bidirectional diodes.

23. The transistor of claim 22, wherein the semiconductor layer structure comprises:

a drift region having a first conductivity type;

a first well region having a second conductivity type in an upper portion of the drift region;

a first implanted region in the first well region, the first implanted region having the first conductivity type; and a second implanted region that has the second conductivity type, wherein the plurality of diodes comprises a first diode that comprises the first and second implanted regions.

24. The transistor of claim 23, wherein the first implanted region directly contacts a gate structure, where the gate structure comprises the gate terminal or a structure that is electrically connected to the gate terminal.

25. The transistor of claim 24, wherein the second implanted region directly contacts a metal connector that is between the gate structure and a source/drain contact that is electrically connected to the second current terminal.

26. The transistor of claim 25, wherein the plurality of diodes further comprises a second diode that is formed in the semiconductor layer structure and that at least partially vertically overlaps the metal connector.

27. The transistor of claim 26, wherein the second diode comprises a second well region having a second conductivity type in the upper portion of the drift region;

a fifth implanted region in the second well region, the fifth implanted region having the first conductivity type; and a sixth implanted region that is at least partially in the second well region, the sixth implanted region having the second conductivity type.

28. The transistor of claim 27, wherein the fifth implanted region directly contacts the metal connector and the sixth implanted region directly contacts the source/drain contact.

29. The transistor of claim 13, wherein the at least one diode comprises a first diode and a second diode coupled in series between the second current terminal and the gate terminal, and wherein an anode of the first diode is coupled to the second current terminal, and a cathode of the first diode is coupled to an anode of the second diode.

30. The transistor of claim 29, wherein the semiconductor layer structure comprises a drift region, wherein the first diode comprises at least one first implanted region comprising silicon carbide in the drift region, and wherein the second diode comprises at least one second implanted region comprising silicon carbide in the drift region.

31. The transistor of claim 29, wherein the first and second diodes are implemented in an additional semiconductor layer on the semiconductor layer structure, and wherein a dielectric layer is between the additional semiconductor layer and the semiconductor layer structure.

* * * * *